(12) United States Patent
Bathul et al.

(10) Patent No.: US 7,130,210 B2
(45) Date of Patent: Oct. 31, 2006

(54) MULTI-LEVEL ONO FLASH PROGRAM ALGORITHM FOR THRESHOLD WIDTH CONTROL

(75) Inventors: Fatima Bathul, Cupertino, CA (US); Darlene Hamilton, San Jose, CA (US); Masato Horiike, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 9 days.

(21) Appl. No.: 11/034,642

(22) Filed: Jan. 13, 2005

(65) Prior Publication Data

US 2006/0152974 A1 Jul. 13, 2006

(51) Int. Cl.
G11C 17/00 (2006.01)
(52) U.S. Cl. .................... 365/100; 365/185.03
(58) Field of Classification Search ............. 365/100, 365/185.03, 185.28
See application file for complete search history.

(56) References Cited

U.S. PATENT DOCUMENTS

| | | | |
|---|---|---|---|
| 6,856,551 B1 * | 2/2005 | Mokhlesi et al. | 365/185.28 |
| 2005/0248989 A1 * | 11/2005 | Guterman et al. | 365/185.28 |
| 2005/0286304 A1 * | 12/2005 | Krishnamachari et al. | 365/185.19 |

* cited by examiner

Primary Examiner—Michael Tran
(74) Attorney, Agent, or Firm—Eschweiler & Associates, LLC

(57) ABSTRACT

Methods of programming a wordline of multi-level flash memory cells (MLB) having three or more data levels per bit corresponding to three or more threshold voltages are provided. The present invention employs an interactive program algorithm that programs the bits of the wordline of memory cells in two programming phases, comprising a rough programming phase and a fine programming phase to achieve highly compact Vt distributions. In one example, cell bit-pairs that are to be programmed to the same program pattern are selected along a wordline. Groups of sample bits are chosen for each wordline to represent each possible program level. The sample bits are then programmed to determine a corresponding drain voltage at which each sample group is first programmed. This fast-bit drain voltage (Fvd) for each program level essentially provides a wordline specific program characterization of the Vt required for the remaining bits of that wordline. In the rough programming phase, the bits of core cells are then programmed from a starting point that is relative to (e.g., slightly less than or equal to) the fast-bit Vd and according to a predetermined Vd and Vg profile of programming pulses. The bits of the complementary bit-pairs are alternately programmed in this way until the Vt of the bits attains a rough Vt level, which is offset lower than the final target threshold voltage level. Then in the second fine programming phase, the bits of the MLB cells of the wordline are further programmed with another predetermined Vd and Vg profile of programming pulses until the final target threshold voltage is achieved. The Vd and Vg profiles of programming pulses may further be tailored to accommodate the various bit-pair program pattern combinations possible. In this way, the bits of each wordline are fine-tune programmed to a data state to achieve a more precise Vt distribution, while compensating for the effects of complementary bit disturb.

53 Claims, 13 Drawing Sheets

| Program Pattern of the bit-pair ||
|---|---|
| Program Bit (*e.g.*, "A" bit) | Other Bit (*e.g.*, "B" bit) |
| 2 | 1 |
| 2 | 2 |
| 2 | 3 |
| 2 | 4 |
| 3 | 1 |
| 3 | 2 |
| 3 | 3 |
| 3 | 4 |
| 4 | 1 |
| 4 | 2 |
| 4 | 3 |
| 4 | 4 |

MULTI-LEVEL ONO FLASH PROGRAM ALGORITHM FOR THRESHOLD WIDTH CONTROL

FIELD OF INVENTION

The present invention relates generally to memory devices and the like, and in particular to a method of programming sectors of cells with multiple-level data states in flash memory devices.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual-bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks ease of erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc.

Flash memory is generally constructed of many memory cells where, generally, single bits of data are stored in and read from respective memory cells. The cells are generally programmed by hot electron injection and erased by Fowler-Nordheim tunneling or other mechanisms. As with many aspects of the semiconductor industry, there is a continuing desire and effort to achieve higher device packing densities and increase the number of memory cells on a semiconductor wafer. Similarly, increased device speed and performance are also desired to allow more data to be stored on smaller memory devices.

Individual flash memory cells are organized into individually addressable units or groups, which are accessed for read, program, or erase operations through address decoding circuitry. The individual memory cells are typically comprised of a semiconductor structure adapted for storing a bit of data and includes appropriate decoding and group selection circuitry, as well as circuitry to provide voltages to the cells being operated upon.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

Programming circuitry controls a bit of a cell by applying a signal to a wordline, which acts as a control gate, and changing bitline connections such that the bit is stored by the source and drain connections. Programming a cell using a suitable mechanism such as hot electron injection, generally increases the threshold voltage of a cell. In operation, individual flash cells are addressed via the respective bitline and wordline using a peripheral decoder and control circuitry for programming (writing), reading or erasing functions. Erasing is performed as a blanket operation wherein an array or sector of cells can be simultaneously erased and typically produces a lower threshold voltage in the cell.

By way of further detail, a single bit flash memory cell may be programmed by a suitable mechanism, such as hot electron injection. Programming with hot-electron injection involves applying a relatively high voltage to the control gate and connecting the source to ground and the drain to a predetermined potential above the source. When a resulting electric field is high enough, electrons collect enough energy to be injected from the source onto the nitride layer of the ONO flash. As a result of the trapped electrons, the threshold voltage of the cell increases. This change in the threshold voltage (and thereby the channel conductance) of the cell created by the trapped electrons is what causes the cell to be programmed.

As with many aspects of the semiconductor industry, there is a continuing desire to scale down device dimensions to achieve higher device packing densities on semiconductor wafers. Similarly, increased device speed and performance are also desired to allow more data to be stored on smaller memory devices. Accordingly, there are ongoing efforts to, among other things, increase the number of memory cells that can be packed on a semiconductor wafer (or die).

For example, another type of flash memory is dual sided ONO flash memory, which allows multiple bits to be stored in a single cell. In this technology, a memory cell is essentially split into two identical (mirrored) or complementary regions, each of which is formulated for storing one of two independent bits. Each dual sided ONO flash memory cell, like a traditional cell, has a gate, a source, and a drain. However, unlike a traditional stacked gate cell in which the source is always connected to an electrical source and the drain is always connected to an electrical drain, respective dual sided ONO flash memory cells can have the connections of the source and drain reversed during operation to permit the storing of two bits.

In a virtual ground type architecture, dual sided ONO flash memory cells have a semiconductor substrate with conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts as a control gate, and changing bitline connections such that one bit is stored by the source and drain being connected in one arrangement and a complementary bit is stored by the source and drain being connected in another arrangement.

The closeness of such dual sided ONO flash architectures, however, also causes certain undesirable phenomena to become prevalent. For example, isolating two bits or charges stored within a charge trapping layer becomes increasingly difficult as the channel length is decreased and the bits are brought closer together. In this manner, the charge on the bits can contaminate or disturb one another, causing operations performed on the bits to be more challenging and introducing a greater opportunity for error. This interdependency or the affect that bits can have on one another is sometimes referred to as complementary bit disturb or CBD.

Regardless of the flash architecture employed, reliably and accurately programming dual sided ONO flash and multi-level flash cells can be particularly sensitive with the attendant complications of maintaining narrow Vt distributions in order to accurately read and determine a data state from a corresponding Vt level. In addition, even if such narrow distributions are attained for the various multiple levels, unless sectors of memory cells can be programmed to within the acceptable limits quickly, efficiently, and reliably, little competitive advantage may be gained.

In view of the foregoing, a need exists for an improved method of quickly and efficiently programming multi-level flash memory cells of a sector or array while maintaining CBD control to achieve narrow Vt distributions of the programmed bit states.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention programs a wordline of multi-level flash memory bits (MLB) having three or more data levels or data states corresponding to three or more threshold voltages by applying an interactive program algorithm that programs the wordline of memory cells in two programming phases, comprising a rough programming phase and a fine programming phase to achieve highly compact Vt distributions. The three or more data levels or data states include a blank level or erased state and two or more programmed levels. In addition, the method of the present invention is applicable to cells having one or more physical bits per cell.

In one implementation, cell bit-pairs (e.g., dual sided ONO flash cells having two physical bits or complementary bits per cell) that are to be programmed to the same program pattern or multiple patterns are selected along a wordline. Groups of sample bits are first chosen for each wordline to represent each possible program level (e.g., L2 (2 samples), L3 (3 samples), L4 (4 samples) ... Ln (n samples)). The sample bits within each group are then programmed to determine a corresponding minimal drain voltage at which bits in each group is first programmed. This fast-bit drain voltage (Fvd) for each program level (e.g., Fvd1 for L2, Fvd2 for L3, Fvd3 for L4 ... Fvdn for Ln+1) essentially provides a wordline specific program characterization of the Vt required for the remaining bits of the core on that wordline (WL).

In the rough programming phase, the core cells along the wordline are then programmed using a drain voltage starting from a point that is relative to the fast-bit Vd (Fvd) (e.g., a fixed offset less than, equal to or greater than Fvd). Programming continues until programming is done according to a predetermined Vd and Vg profile of successive programming pulses (e.g., about 50–200 mV step per program pulse of about 150 ns–2 µs pulse width) applied to the memory cells. The bits of the complementary bit-pairs are alternately programmed in this way, until the Vt of the individual bits achieve their rough Vt-threshold level, which is offset lower than the final target threshold voltage (e.g., an offset of about 150–450 mV lower than the target Vt).

Then in the fine programming phase, the MLB cells of the wordline are further programmed with another predetermined Vd and Vg profile of successive programming pulses until the final target threshold voltage is achieved. In another aspect of the invention, the Vd and Vg profiles of programming pulses may further be tailored to accommodate the various combinations of program patterns possible within the bit-pair. For example, in a dual sided ONO flash four level cell, there are 16 possible states, combinations of bit-pairs or program patterns (e.g., 11, 12, 21, 13, 31, 14, 41, 22, 23, 32, 24, 42, 33, 34, 43, 44). In this way, the cells of each wordline are characterized, roughly programmed, then finely programmed to a data state to achieve a more precise Vt distribution, while compensating for the effects of complementary bit disturb.

The multi-level bit MLB flash memory cell of the present invention may comprise a single physical bit that can be programmed to three or more levels corresponding to three or more data states. Alternately, the MLB cell may comprise a dual sided ONO flash or mirror-bit cell having two physically distinct bits that may each be programmed to multiple levels such as four, wherein 16 possible states are then available. The method may be suitably implemented in a variety of flash memory architectures including single and dual sided ONO flash EEPROM, and other such single or multi-bit memory architectures that may be electrically programmed, and any such cell or variant is contemplated as falling within the scope of the present invention.

In another aspect of the present invention, the programming profile of gate and drain voltages is determined by a look-up table corresponding to the program pattern of the cell bit-pairs. In yet another aspect of the invention, either the drain voltage or the gate voltage is held constant while the other of the voltages follows the programming profile.

The present invention provides a method of programming a wordline of an array of MLB memory cells that yields a well controlled narrow Vt distribution using minimal programming time, while maintaining CBD control.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 5 is a chart of possible program pattern combinations for a dual sided ONO flash memory cell where each of the bits can be stored at four (4) different data levels and where a program bit is programmed to a non-blank level in accordance the method of the present invention.

DETAILED DESCRIPTION OF THE INVENTION

Figure 1:
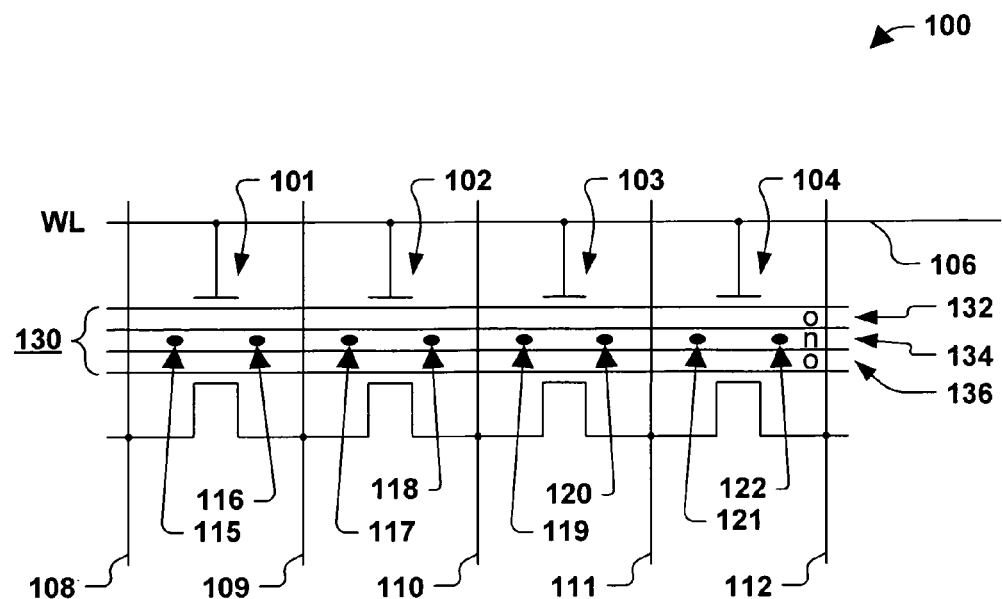
FIG. 1 is a schematic illustration of a portion of a wordline of dual sided ONO flash memory cells.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

Improvements in the density of memory devices translate to increased memory capacity. Density and thus capacity is a major consideration in the cost of fabrication and the marketability of memory devices, and is directly related to the amount of real estate used to store a bit of information on a semiconductor chip. Density may be increased, for example, by scaling down feature size to accommodate more memory cell transistors on a given size chip thereby achieving higher density. Another technique to increase density and reduce manufacturing costs is thru the use of multi-level cell technology.

Multi-level cells increase cell density by increasing the number of possible logical states or data states associated with a cell, thereby allowing a single memory cell to store information corresponding to more than one data bit. One way this has been done is by using multiple (three or more, in the context of cell levels and states) threshold voltage (Vt) levels, which correspond to multiple data states per cell. This contrasts to the two states and levels used in conventional flash memory cells. Thus, in one example, a single dual sided ONO flash cell may have two physical bits of data each at four or more Vt levels corresponding to four logical states. Cells, having multiple levels, however, present many new problems attempting to maintain well controlled or tight distributions of the Vt levels, particularly as larger data bit quantities are considered.

As a result of these trends, accurate erasure, programming, and the determination of the levels of such multi-level cells becomes increasingly demanding, particularly as higher bit capacities are expected of a single cell. Accordingly, multi-level memory cells need to be programmed quickly and efficiently to save program operations time and power consumption. In addition, the cells need to be programmed to a well controlled narrow program Vt distribution (tight bit compacting). Such device requirements and issues are likely to increase as device features continue to shrink and the density of memory cells increases.

As indicated previously, however, due to such high density architectures that include dual sided ONO flash type cell structures, the charge on the bits can contaminate or disturb one another referred to as complementary bit disturb or CBD. This interdependency or the affect that bits can have on one another causes operations performed on the bits to become more challenging and introducing greater opportunity for error. As a result, effectively programming such dual sided ONO flash and multi-level cells in this environment must consider minimizing such CBD effects.

Accordingly, it is a goal of the present invention to provide a method of programming a wordline of an array of suitable MLB flash memory cells, which achieves the aforementioned requirements while also providing improved Vt program distributions, levels of speed, endurance, reliability, as well as minimal CBD effects.

A multi-level program algorithm may be used in accordance with the present invention to program words having, for example, 8, 16, or 32 bits per word of an array of multi-level flash memory cells MLB to a desired bit-pair pattern. The program algorithm of the present invention may be applied in two or more program phases, for example. In a first or rough programming phase, the programming algorithm rough programs the bits of the wordline of complementary bits to a predetermined offset less than the target Vt (rough program Vt). All the bits of the wordline receive program pulses in a predetermined profile of gate and drain voltages (Vg and Vd, respectively) applied successively and alternately to bitline portions of the word, to maintain CBD control of the complementary bits. As bits of the wordline become programmed to this rough program Vt, the programmed bits are read verified to the rough program Vt and deselected from the wordline to prevent over-programming, while programming continues for the other bits yet to be programmed to the desired Vt.

In the final or fine programming phase, the program algorithm more finely programs all the bits using preferably smaller program pulse iterations of the gate and drain voltages to program the bits to the final or target Vt for the respective program levels desired. As the bits now become programmed to the final target Vt (e.g., a higher Vt) corresponding to a final data state of the bits, the programmed bits are once again deselected from the wordline to prevent over-programming. Preferably, the algorithm selects the gate and drain voltage program profile which is most beneficial to minimize the CBD for the bit-pair program pattern initially selected for the wordline. The algorithm achieves well controlled compact Vt distributions compared to those of some conventional single phase methods. The method may be suitably implemented in a variety of flash memory architectures including single and dual sided ONO flash EEPROM, and other such single and multi-bit memory architectures that may be electrically programmed, and any such cell or variant is contemplated as falling within the scope of the present invention.

Referring initially to FIG. 1, a schematic illustration is presented of a portion of a wordline of dual sided ONO flash core memory cells 100 such as may be included in at least part of an array of multi-level flash memory cells. The circuit schematic shows a group of memory cells 101 through 104 in a virtual ground type implementation, for example. The respective memory cells 101 through 104 are connected to a wordline 106, which serves as a control gate, and pairs of the memory cells share a common bitline. For instance, in the example shown, the memory cell 101 has associated bitlines 108 and 109; the memory cell 102 has associated bitlines 109 and 110; the memory cell 103 has associated bitlines 110 and 111; and the memory cell 104 has associated bitlines 111 and 112. As such, cells 101 and 102 share bitline 109, cells 102 and 103 share bitline 110 and cells 103 and 104 share bitline 111, respectively.

Depending upon wordline voltages and bitline connections, the memory cells 101 through 104 are capable of writing, reading, and erasing bits at locations 115 through 122. In addition to voltages applied to the wordline 106, reading the bit (e.g., "A" bit of cell 101) at location 115, for example, is achieved through connection of the drain to the bitline 109 and the source to the bitline 108. Similarly, reading the bit (e.g., "B" bit of cell 101) at location 116 is achieved through connection of the drain to the bitline 108 and the source to the bitline 109. Storage of multiple bits is made possible, at least in part, by a charge trapping dielectric layer 130 interposed between the bitlines and the wordline. The charge trapping dielectric layer 130 includes multiple insulating layers 132, 136 (e.g., of oxide based material) that sandwich a charge trapping layer 134 (e.g., of nitride based material). Given its layer to layer composition, the charge trapping dielectric layer 130 is often referred to as an ONO layer (for the oxide, nitride, oxide layers).

The ONO layer 130 allows the different bits to be stored at multiple states or levels as well. For example, depending upon the voltage applied to the memory cells 101 through 104 by the control gate or wordline 106 during programming, varying amounts of charge can be stored at locations 115 through 122. The different amounts of charge may correspond to different bit states or levels, for example. If four different charge levels or data levels (e.g., 1, 2, 3 and 4) can be stored at each of the bit locations 115 through 122, for example, then each two-bit cell 101 through 104 can have 16 different combinations of stored data (e.g., 1-1, 1-2, 1-3, 1-4, 2-1, 2-2, 2-3, 2-4, 3-1, 3-2, 3-3, 3-4, 4-1, 4-2, 4-3 and 4-4).

Figure 2:
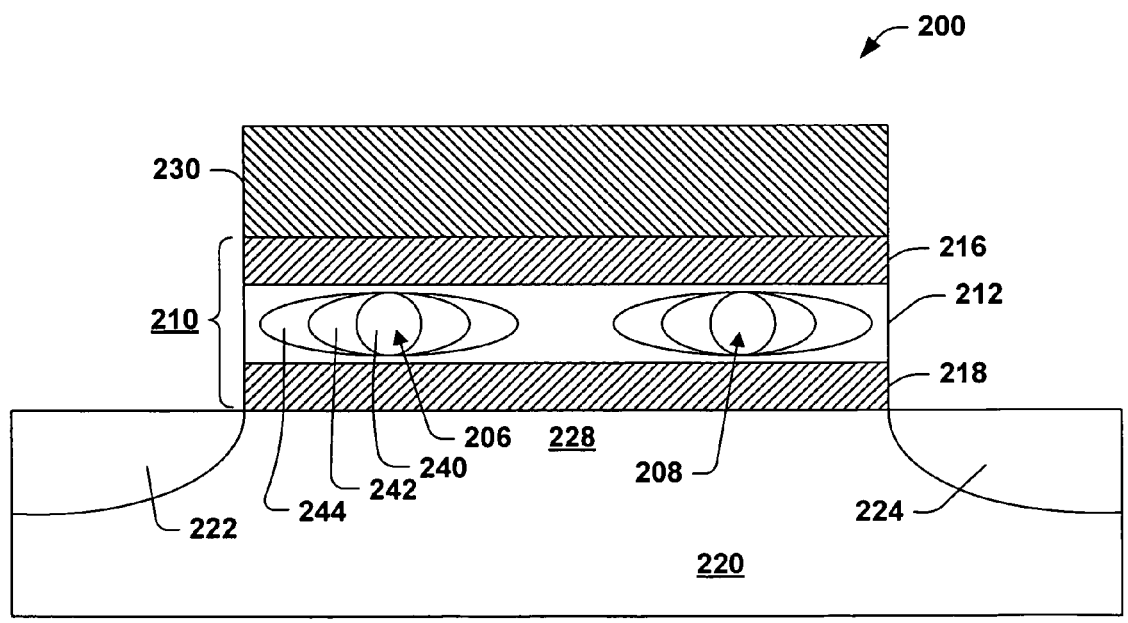
FIG. 2 is a cross-sectional view of a dual sided ONO flash memory cell wherein each of the bits can be stored at multiple levels.

FIG. 2 is a cross sectional view of a dual sided ONO flash memory cell 200 illustrating the capability of the cell to store varying degrees of charge at bit locations 206 and 208. It will be appreciated that the memory cell 200 may, for example, correspond to the memory cells 101 through 104 depicted in FIG. 1. The cell 200 includes a charge trapping dielectric layer (ONO layer) 210 that comprises a charge trapping layer 212 sandwiched between two dielectric layers 216, 218. The charge trapping layer 212 is formed from one or more substantially non-conductive substances, such as nitride based materials. The dielectric layers 216, 218 are similarly formed from one or more electrically insulating substances, such as oxide based materials.

The charge trapping ONO layer 210 is formed over a substrate 220 that may be formed from silicon or some other semiconductor material, for example. The substrate 220 may be selectively doped with a p-type dopant, such as boron, for example, to alter its electrical properties. In the example illustrated, the substrate 220 has buried bitlines or bitline diffusions including a first bitline diffusion 222 and a second bitline diffusion 224. The bitline diffusions 222 and 224 may, for example, be formed by an implanted n-type dopant, and may correspond to bitlines 108 through 112 in FIG. 1. A channel 228 is defined within the substrate between the first 222 and second 224 bitline diffusions (e.g., S/D extensions, deep S/D regions).

Overlying the upper dielectric layer 216 of the ONO layer 210 is a gate 230. This gate 230 may be formed from a polysilicon material, for example, and may be doped with an n-type impurity (e.g., phosphorus) to alter its electrical behavior. The gate 230 may, for example, correspond to the wordlines 106 in FIG. 1. The gate 230 enables a voltage to be applied to the cell 230 such that respective charges can, among other things, be stored within the cell at locations 206, 208, depending upon the electrical connections of the bitline diffusions 222, 224.

The dual sided ONO flash memory cell 200 is generally symmetrical, thus the bitline diffusions 222 and 224 are interchangeable as acting source and drain. Thus, the first bitline diffusion 222 may serve as the source and the second bitline diffusion 224 as the drain with respect to right bit location 208 for programming. Likewise, the second bitline diffusion 224 may serve as the source and the first bitline diffusion 222 as the drain for the left bit location 206 for programming. The cell 200 can be programmed by applying a voltage across the gate 230 and an acting drain region, and connecting an acting source region to ground.

When programming the cell 200, the acting drain region is typically biased to a potential above the acting source. As a result of the gate bias, a high electric field is applied across the charge trapping layer 212. Due to a phenomenon known as "hot electron injection", electrons pass from the acting source region through the lower dielectric layer 218 and become trapped in the charge trapping layer 212 at locations 206 or 208. It will be appreciated that a second bit can be programmed to the alternate location 208 or 206 by reversing the acting source and drain and again applying a bias to the control gate 230.

By way of example, the left bit location 206 can be programmed by applying a program voltage to the gate 230 and a drain voltage to the second bitline 222, which is an acting drain for the left location 206. The first bitline 224, which is an acting source for programming the left bit location 206, can be connected to ground, or biased to a different voltage level. The applied voltages generate a vertical electric field through the dielectric layers 218 and 216 and also through the charge trapping layer 212, and generate a lateral electric field across a length of the channel 228 from the first bitline diffusion 222 to the second bitline diffusion 224. At a given voltage, the channel 228 inverts such that electrons are drawn off the acting source (the first bitline diffusion 224 in this example) and begin accelerating towards the acting drain (the second bitline diffusion 222 in this example).

As the electrons move along the length of the channel 228, the electrons gain energy and, upon attaining enough energy, the electrons jump over the potential barrier of the bottom dielectric layer 218 and into the charge trapping layer 212, where the electrons become trapped. The probability of electrons jumping the potential barrier in this arrangement is a maximum in the area of the left bit location 206, adjacent the first bitline diffusion 222, where the electrons have gained the most energy. These accelerated electrons are termed hot electrons and, once injected into the charge trapping layer 212, stay in about the general area indicated for the left bit. The trapped electrons tend to remain generally localized due to the low conductivity of the charge trapping layer 212 and the low lateral electric field therein. Programming the right bit location 208 is similar, but the first bitline 224 operates as an acting drain and the second 222 operates as an acting source.

For a read operation, a certain voltage bias is applied across an acting drain to an acting source of the cell 200. The acting drain of the cell is a bitline, which may be connected to the drains of other cells in a byte or word group. A voltage is then applied to the gate 230 (e.g., the wordline) of the memory cell 200 in order to cause a current to flow from the acting drain to the acting source. The resulting current is measured, by which a determination is made as to the value of the data stored in the cell. For example, if the current is above a certain threshold, the bit is deemed unprogrammed or a logical one, whereas if the current is below a certain threshold, the bit is deemed to be programmed or a logical zero. A second bit can be read by reversing operations of the first and second bitline diffusions 222 and 224 for the acting drain and the acting source.

It can be appreciated that if the voltages utilized to program the left 206 and right 208 bit locations of the cell 200 are increased or sustained for longer periods of time, the number of electrons or amount of charge stored at these locations can be increased or otherwise varied. This allows the cell 200 to be utilized for additional data storage. For example, different amounts of charge can correspond to different programmed states. In the example illustrated, for instance, both the left 206 and right 208 bit locations can be said to have four different states or levels, namely 1, 2, 3 and 4, where level 1 (L1) corresponds to a situation where the locations are blank or un-programmed, and levels 2, 3 and 4 (L2, L3, and L4, respectively) correspond to increased amounts of stored charge, respectively. With regard to the left bit location 206, for example, a level 2 may correspond to a relatively small amount of stored charge 240, while levels 3 and 4 may correspond to increasingly larger amounts of stored charge 242 and 244, respectively. As indicated previously, this technique is also called multi-level cell technology, which is useful to increase density and reduce manufacturing costs.

Multi-level cells increase the effective cell density by increasing the number of possible logical states or data states associated with a cell, thereby allowing a single memory cell to store information corresponding to more than one data bit. One way this has been done is by using multiple (three or more, in the context of cell levels and states) threshold voltage (Vt) levels, which correspond to multiple data states per cell. This contrasts to the two states or levels used in conventional flash memory cells. Thus, in the example above, a single dual sided ONO flash cell may store in each of its two physical bits four Vt levels corresponding to four logical states.

Figure 3:
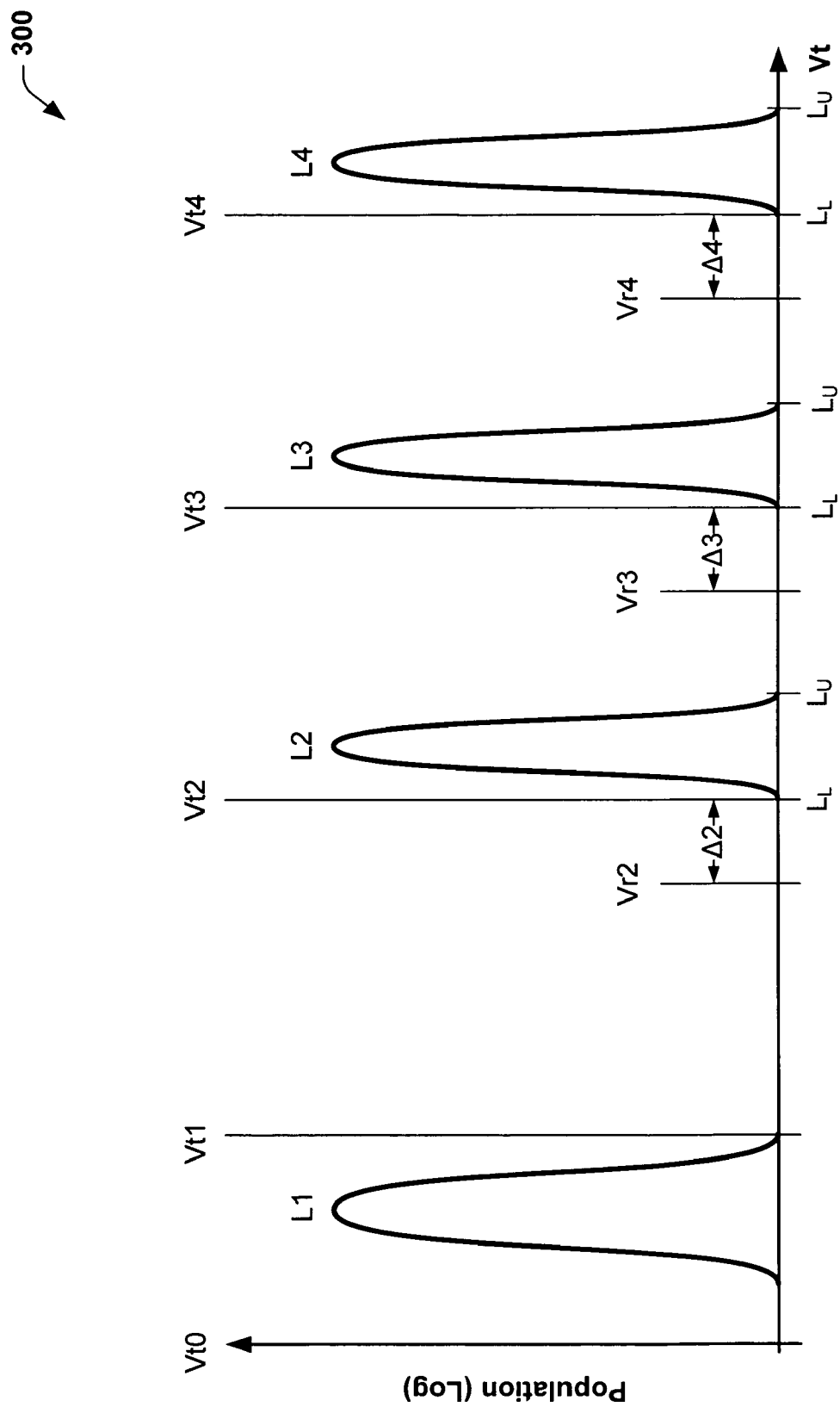
FIG. 3 is a Vt distribution of a four level multi-level cell in accordance with an aspect of the present invention and such as may apply to the dual sided ONO flash cell of FIG. 2.

For example, FIG. 3 illustrates an unsigned Vt distribution 300 of a four level MLB cell in accordance with an aspect of the present invention is illustrated. Vt distribution 300 represents four discrete populations of memory bit threshold voltages. Each threshold voltage population occupies a range of Vt values separated into four discrete levels designated levels L1, L2, L3, and L4. Each level (e.g., L1, L2, L3, and L4) of the respective Vt population further has a corresponding target threshold voltage, for example, Vt1, Vt2, Vt3, and Vt4, respectively. For purposes of simpler program and read verification, the target threshold voltage for the corresponding level may be located at one of the upper or lower Vt limits of the respective level as shown. For example, if L1 is chosen as the erased state of a four-level device, a voltage read detected below Vt1 indicates an erased or unprogrammed state, while a Vt voltage detected greater than Vt2 but less than Vt3 indicates an L2 level, a Vt voltage detected greater than Vt3 but less than Vt4 indicates an L3 level, and a Vt voltage detected greater than Vt4 indicates an L4 level.

The various levels of FIG. 3, however, may be arbitrarily assigned corresponding binary states (e.g., L1=11, L2=10, L3=01, and L4=00, or L1=00, L2=01, L3=10, and L4=11) as desired by the user. The four-level MLB cell associated with the distribution 300 may comprise a single physical bit that can be programmed to two levels or more (plus a blank level), or alternatively, may comprise a dual sided ONO flash cell having two physically distinct bits that may each have multiple levels such as four, wherein 16 or more possible combinations of states between two bits.

The method of the present invention is suitably implemented in MLB memory devices having any number of levels and combination of both positive and negative Vt distributions. In FIG. 3, for example, the method of the present invention is equally applicable whether Vt0 or Vt1, Vt4, or another such Vt limit is used as a zero voltage potential or another reference potential of the memory cells. Although the example would seem to imply that the L1 level corresponds to the erased condition, the L1, L4, or any other level may represent the erased state. Further, target threshold voltages Vt2, Vt3, and Vt4 may, for example, have values such as Vt2=1.5V, Vt3=2.1V, and Vt4=2.7V.

Considering the four levels of FIG. 3 as applied to the dual sided ONO flash memory bits examples of FIGS. 1 and 2, the method of the present invention may be used to program memory bits initially erased to L1 data states to an intermediate or rough threshold voltage value (e.g., Vr2, Vr3, Vr4) somewhat below, for example, the target threshold voltage of Vt2, Vt3, or Vt4, as desired, corresponding to the L2, L3, and L4 data states in a first or rough programming phase operation. As shown in FIG. 3, the rough threshold voltage value (e.g., Vr2, Vr3, Vr4) is offset (e.g., Δ2, Δ3, Δ4) some predetermined offset value (e.g., about 150–450 mV) less than the target threshold voltages Vt2, Vt3, and Vt4, respectively. In this first rough programming phase, pulses are applied to the bit-pairs chosen along a wordline to be programmed to a common programming pattern, such as 2-4 (L2 for the left bit, and L4 for the right bit) or any other combination of patterns. Pulses are applied according to a predetermined Vd and Vg profile of successive programming pulses (e.g., about 50–200 mV step per program pulse of about 150 ns–2 μs pulse width) applied to the memory cells. The bits of the complementary bit-pairs are alternately programmed in this way, until the Vt of each bit of the bit-pair achieves the respective rough Vt value offset (e.g., about 150–450 mV) lower than the final target threshold voltage.

Then in a second or fine programming phase, the method is used similarly to fine program the bits of the memory cells with another Vd and Vg profile of successive programming pulses to a final target threshold voltage corresponding to the target bit pattern or "program pattern" desired, as will be discussed in greater detail infra.

An objective of the method of the present invention is to narrow, or "compact" the population boundary levels $L_U$ and $L_L$ closer to one another, as is also illustrated in FIG. 3. Sigma is often used to symbolize the standard deviation of such a population, which is a measure of the variability of the population. Accordingly, a smaller sigma indicates a narrower Gaussian distribution of the population, indicating that more bit threshold voltages are populated closer to the target Vt(target).

The contributors of the present invention have realized that to get a predictable and well-controlled programmed Vt distribution from MLB cells, one solution is to first bring all bits within a group to a common lower programmed state having a well controlled Vt distribution. The contributors of the present invention have further observed and appreciated that each time a programming operation is performed on a particular group of memory bits that the group progressively tends to compact themselves closer to the same Vt potential. Accordingly, the inventors have devised an interactive method of iteratively programming the bits in two or more phases between two discrete Vt values. These iterative operations tend to progressively cause the program Vt distributions to narrow and compact toward the target Vt level. Further, an initial erase operation to a controlled target threshold voltage generally enhances the effectiveness of the method of the present invention.

For example, in one aspect of the present invention, program operations are used to insure that the Vd and Vg programming profile covers the fastest and slowest programming bits. By doing so, the fastest programming bits tend to be compensated away from the $L_U$ end of the Vt distribution, while the slowest programming bits are compensated away from the $L_L$ end of the Vt distribution of FIG. 3. Stated another way, in one aspect of the present invention, program operations may be used to reduce the fast-bit Vt population of cells from the $L_U$ boundary, while in another method aspect, program operations may be used to raise the slow-bit Vt population of cells from the $L_L$ boundary. As a result, the inventors have observed that, beneficially, the sigma of the Vt population decreases and compacts the bits with each successive alternate bit programming operation. In this respect, the method of the present invention has some similarities to the technique of successive approximation, in that the Vt distribution of the bits is progressively rough, then fine-tuned toward the target Vt(target) level with each successive operation. As a result, this method may be faster and more energy efficient than some other conventional single phase methods.

Although the methodology is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

Figure 4A:
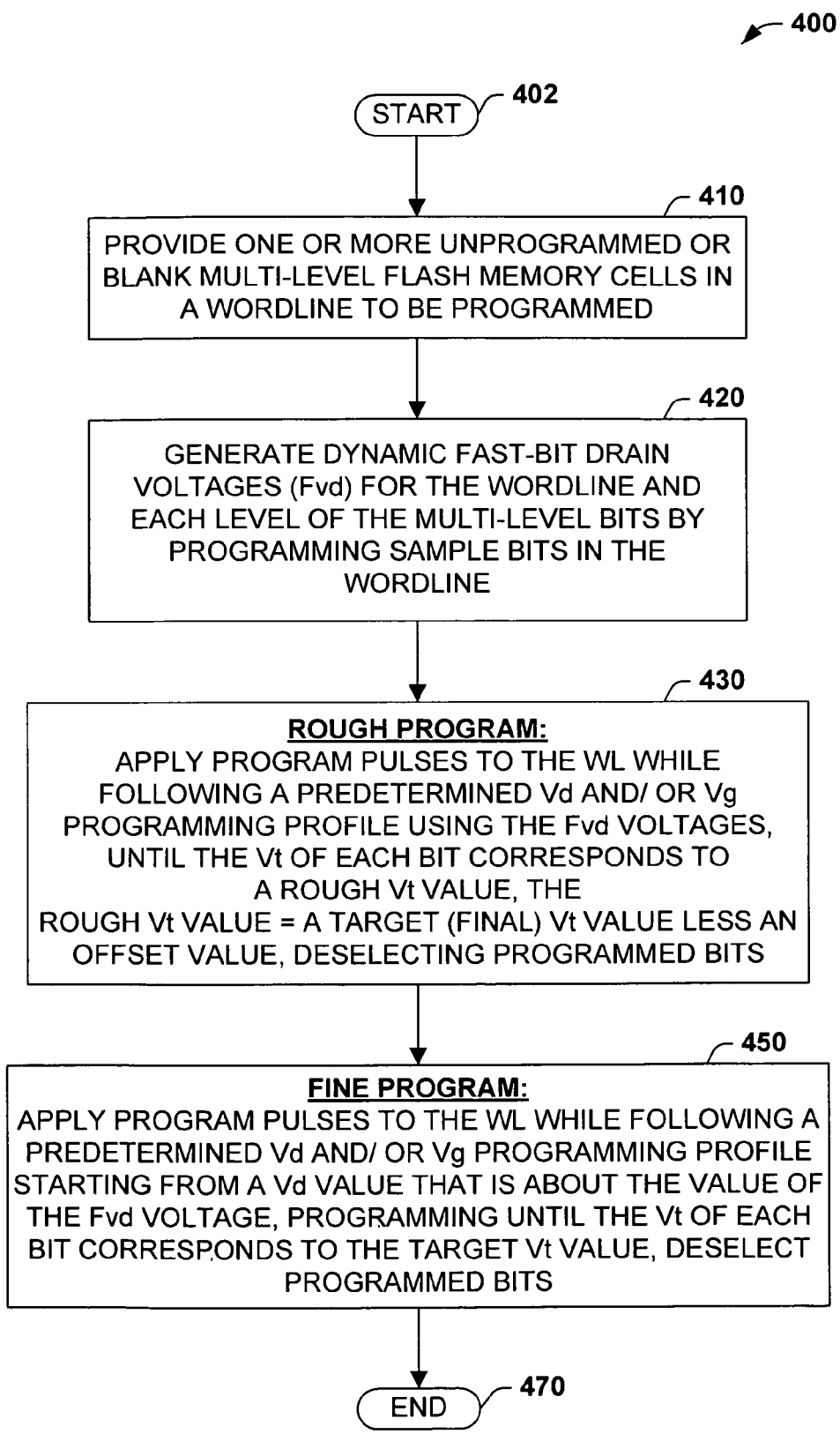
FIG. 4A is flow diagram illustrating an exemplary method of programming a wordline of MLB memory cells that includes a sample bit characterization and a two-phase algorithm for interactively programming memory cells in accordance with an aspect of the present invention.
Figure 4B:
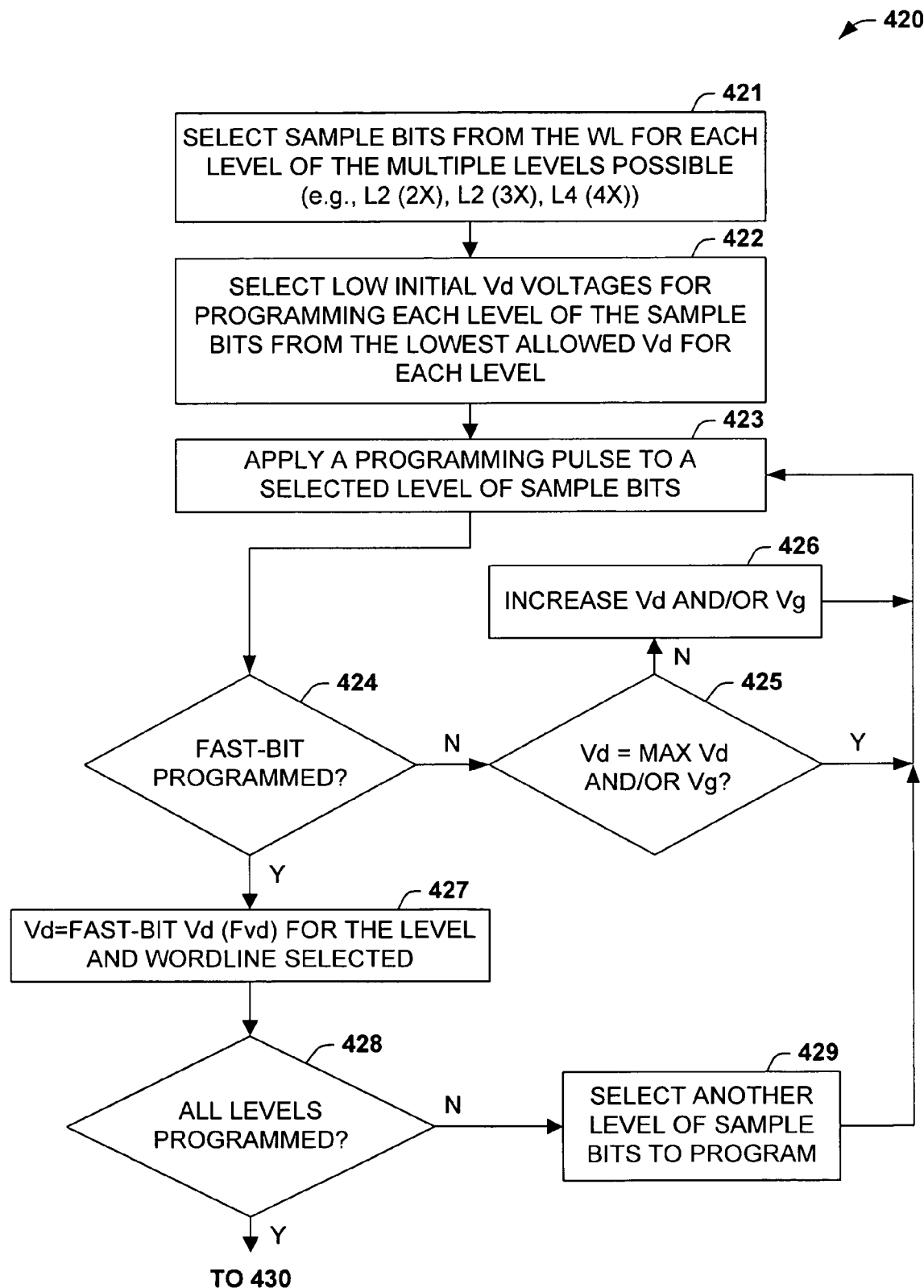
FIGS. 4B–4D are flow diagrams illustrating further details of various portions of the exemplary method of programming a wordline of MLB memory cells in accordance with the programming method of FIG. 4A.
Figure 4C:
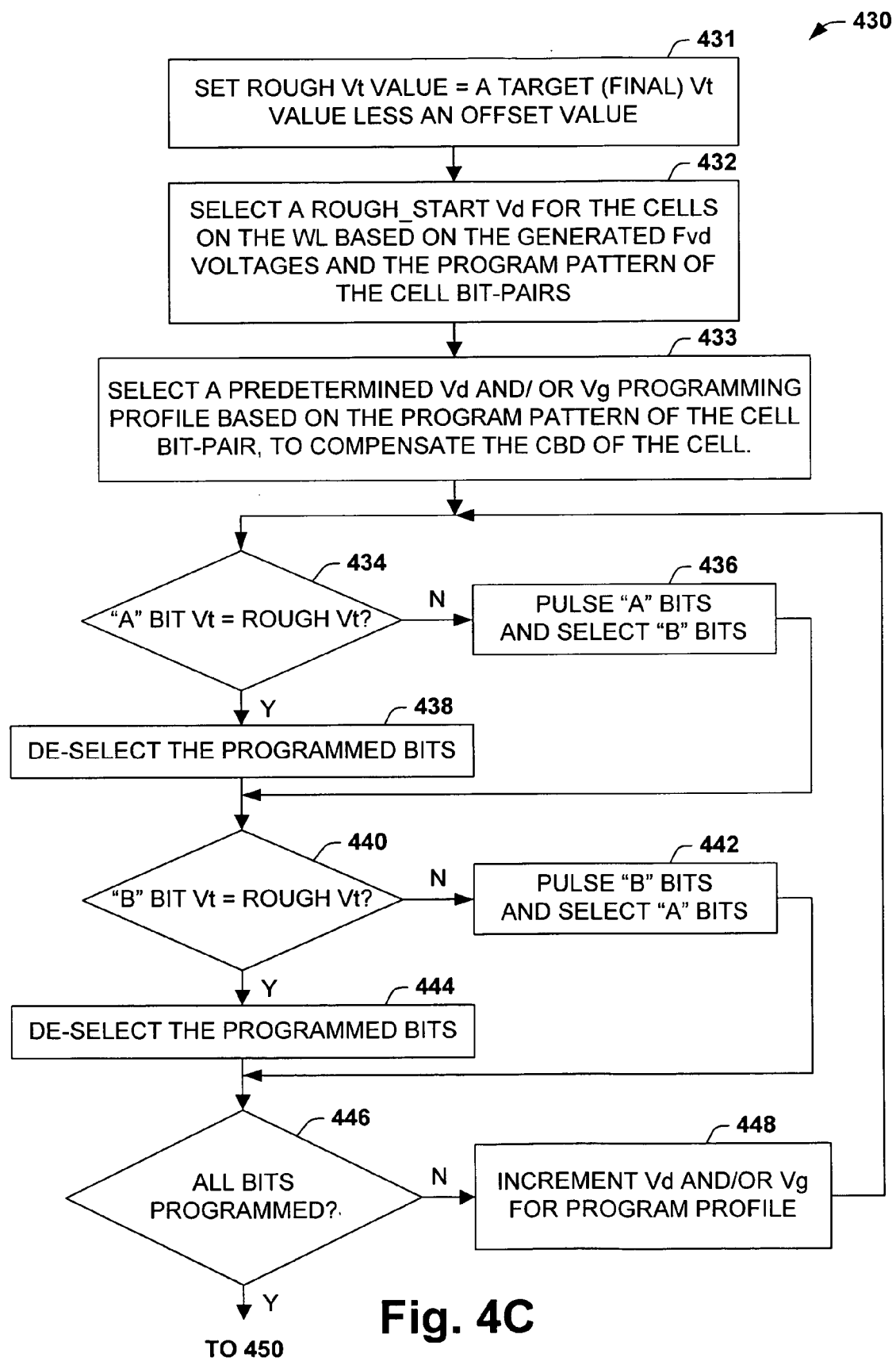
Figure 4D:
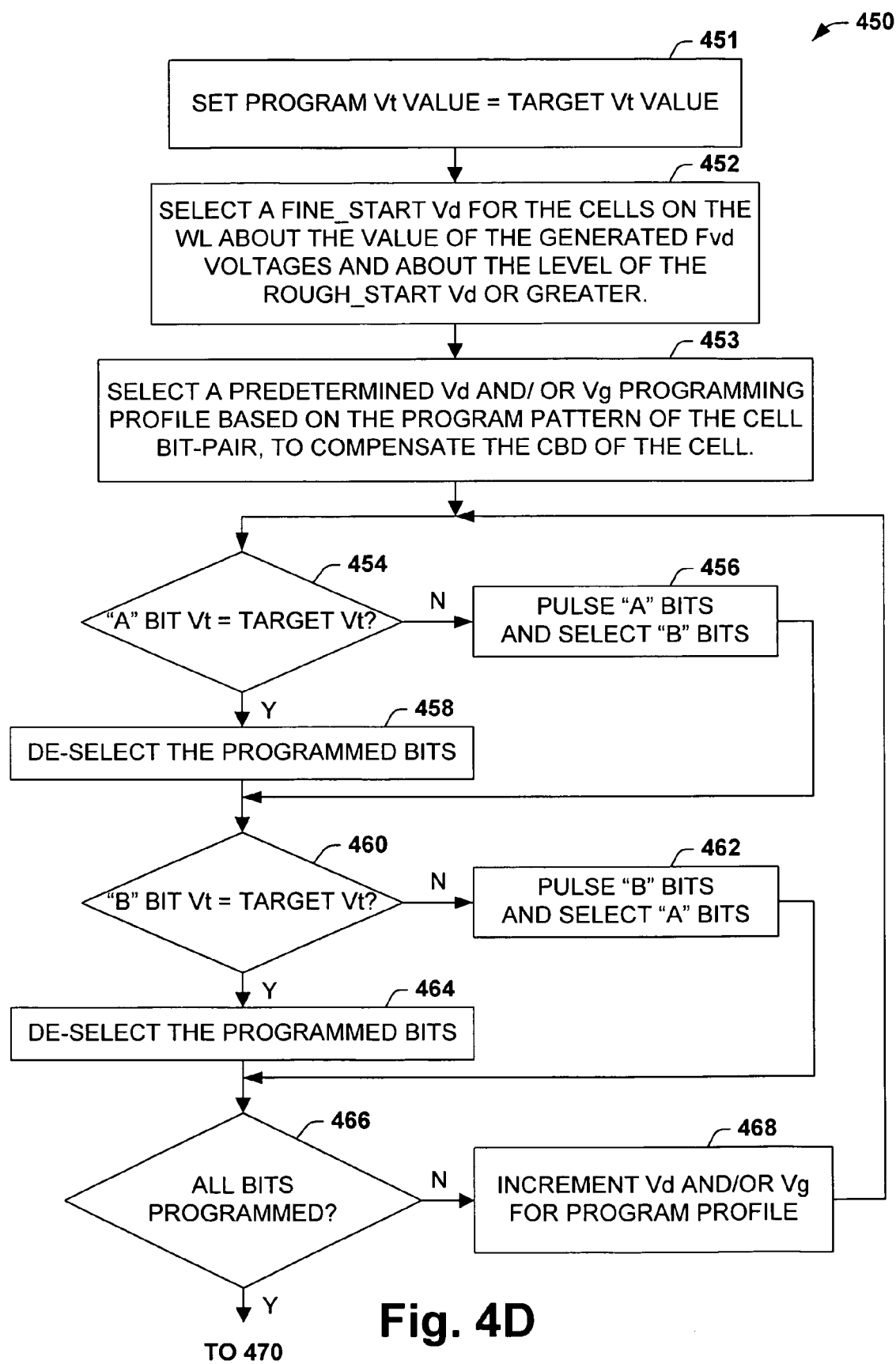

FIG. 4A illustrates a flow diagram of an exemplary method 400 of programming a wordline of a multi-level flash memory bits of an array, each bit having three or more data levels corresponding to three or more threshold voltages in accordance with the present invention. The three or more data levels or data states include a blank level or erased state and two or more programmed levels. While the term "wordline" or "array" is use throughout, it should be understood that such terms are not to be construed as limiting to one specified grouping of cells or bits, but rather may apply to any grouping of MLB cells including single or multi-bit cells. FIGS. 4B–4D further illustrate flow diagrams of details of the various operations of the MLB programming method 400 of FIG. 4A. Assume for the sake of the following method discussion and the examples of FIGS. 4B–4D, a dual sided ONO flash (complementary bit-pair) four-level per bit flash memory cell similar to that of FIGS. 1–3 with L1 representing a blank or erased state, and L4 representing the highest level. Although L1 will represent the erased state in this example, it should be appreciated that method 400 will work for any erase and program level assignments and Vt distribution polarities of MLB memory cells or bits, and such variations are contemplated as falling with the scope of the present invention.

For example, method 400 of FIG. 4A includes a two-phase algorithm for interactively programming memory bits of a wordline in accordance with the present invention. In addition, the exemplary method includes an optional initial sample bit characterization for the purpose of generating dynamic drain voltages for the program levels of the wordline. In the rough program phase 430 of method 400, bits of the cells are essentially programmed to a rough program threshold voltage (e.g., Vr2 of L2 of FIG. 3) that is a predetermined offset value less than the final target threshold voltage (e.g., Vt2 of L2 of FIG. 3). In the second phase the bits of the cells are further programmed to the final threshold voltage (e.g., Vt2 of L2 of FIG. 3). FIGS. 6–11 will further illustrate waveform timings associated with the exemplary method.

For example, the multi-level program algorithm 400 begins at 402. At 410 one or more bits of unprogrammed or blank multi-level flash memory cells (e.g., cells 101–104 of FIG. 1) on a specific wordline (e.g., WL 106 of FIG. 1) are provided by selecting cells that are to be programmed to the same bit-pair program pattern. For example, a group of 8, 16, 32, or higher bits per word multi-level cells that are to be programmed to a "2-4" programming pattern (e.g., L2 on the left bit, and L4 on the right bit) of the bit-pair are selected along a specific wordline. In another example suitable for the method, a similar word grouping of single (physical) bit cells that are to be programmed to a (e.g., L2, L3, L4) level may also be selected along the wordline. Thus, in one example, a word (e.g., of 8, 16, 32, or higher bits per word) cell bit-pairs (e.g., dual sided ONO flash cells having two physical bits or complementary bits per cell) that are to be programmed to the same program pattern are selected along a common wordline.

At 420, before the word is programmed, groups of sample bits are characterized for the selected wordline to determine a fast-bit drain voltage for each program level. In particular, groups of sample bits are first chosen for each wordline to represent each possible program level. Each group of sample bits is then interactively programmed by iteratively applying program pulses until a first "fast-bit" is programmed at each program level. The drain voltage, at which this fast-bit is programmed for each program level, is identified as a fast-bit drain voltage (Fvd) for the respective program level. Generating a dynamic drain voltage in this way essentially provides a wordline specific program characterization of the Vt required for the remaining bits of the core on that wordline (WL).

Act 420 of FIG. 4B further illustrates one implementation of generating these dynamic fast-bit drain voltages. For example, at 421 groups of sample bits are first chosen for each wordline to represent each possible program level (e.g., L2 (x samples), L3 (x samples), L4 (x samples) . . . Ln (x samples)). The actual number of sample bits chosen within each group is arbitrary. Further, these sample bits may be bits that are reserved for this purpose, or they may be later used for data storage. Level L1 is excluded from this list, as L1 represents the erased, blank, or unprogrammed state in this example. At 422, the lowest allowable drain voltage (Vd) for each of the program levels is selected as an initial starting value for subsequently programming each group of sample bits and incrementing drain voltage (Vd) and/or gate voltage (Vg) (e.g., in steps of 50 mV to 200 mV).

Figure 6:
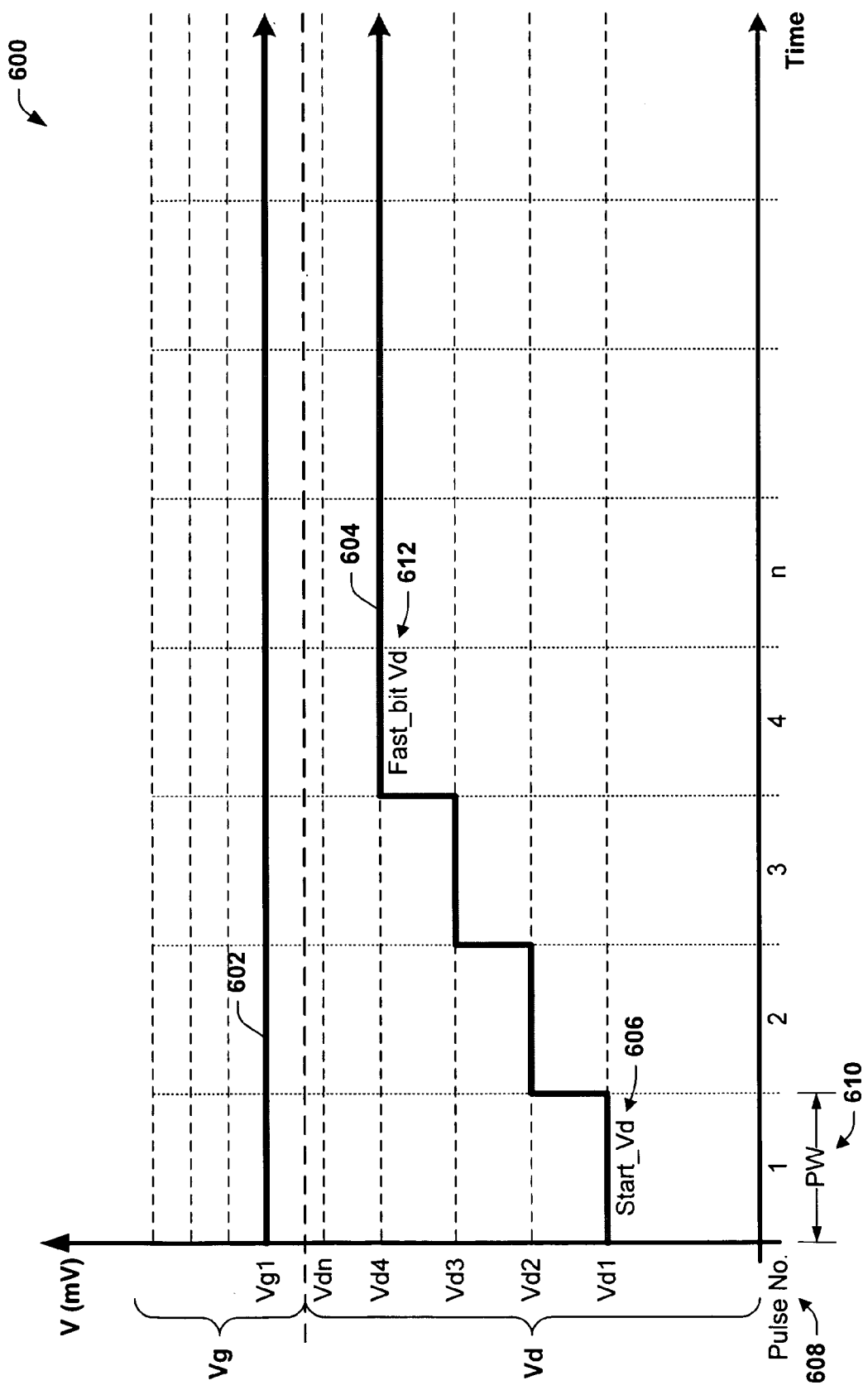
FIGS. 6–11 are plots of exemplary drain and gate voltage profiles as may be used to generate dynamic drain voltages, rough program, and fine program a wordline of multi-level memory cells such as those depicted by FIGS. 1–3 using the two-phase programming algorithm of the present invention of FIGS. 4A–4D.

At 423, a group of the sample bits representing a corresponding programming level is then selected and programming begins by applying program pulses (e.g., having a pulsewidth of about 150 ns–2 µs) from the initial starting Vd value. FIG. 6 further illustrates an exemplary waveform timing associated with this sample programming method. After each programming pulse, the sample bits within a group are read verified at 424 of FIG. 4B to determine if any of the bits have become programmed. If is determined at 424 that no bits have yet become programmed to the selected level, and that the applied Vd is below the maximum allowable drain voltage at 425, the Vd and/or the Vg voltage is increased at 426 (e.g., in steps of 50 mV to 200 mV) and another pulse (e.g., 150 ns–2 µs pulsewidth) is applied to the group of sample bits at 423. Such pulsing and increasing of the Vd and/or the Vg voltage continues in this way until at 425 the maximum Vd and/or Vg is achieved or at 424 one of the sample bits has become programmed and a fast-bit drain voltage (Fvd) is therefore identified at 427. At 428, if it is determined that not all program levels have been programmed, then another level of sample bits is selected to be programmed at 429. Programming continues in this way until a fast-bit voltage is generated dynamically for each program level (e.g., Fvd1 for L2, Fvd2 for L3, Fvd3 for L4 . . . Fvdn for Ln+1) and the method continues back to 430 of FIG. 4A.

At 430 of FIG. 4A, a rough programming operation is performed on bits of the core memory cells of the wordline based on the fast-bit drain voltages generated and the selected cell program pattern until the bits generally correspond to a rough threshold voltage, wherein the rough threshold voltage is a predetermined offset value less than the target threshold voltage. By programming to this lower Vt value, for example, the bits of the memory cells may be programmed near to the target Vt without actually exceeding the target Vt and becoming over programmed.

Act 430 of FIG. 4C further illustrates details of one example of rough programming the bits of the word of memory cells to the rough Vt value. At 431, the rough Vt value that the bits will be programmed to is set according to the target Vt value (e.g., Vt2, Vt3, Vt4) used for the desired program level (e.g., L2, L3, L4) and offsetting this voltage by a predetermined offset value (e.g., 150–450 mV) less than the target threshold voltage. At 432, a rough_start Vd value is selected for the start of the rough programming operation relative to the fast-bit voltages Fvd generated at 420 and based on the selected program pattern of the cell bit-pairs. For example, FIG. 5 illustrates twelve such exemplary program patterns 500 that are possible, for a complementary bit-pair having four data levels, from the perspective of a "program bit" 502 and an "other bit" 504 (e.g., "A" bits and "B" bits of the bit-pairs). These program patterns are used as a basis for adjusting the profile of the Vd and/or Vg levels for programming to compensate for the CBD effects otherwise produced during programming complementary bit-pairs. A look-up table may, for example, be employed to correlate the program pattern selected to a corresponding Vd and/or Vg programming profile. The rough_start Vd, for example, may be a voltage level calculated as a predetermined number of voltage steps offset (e.g., below) the fast_bit Vd as generated at 420.

Figure 7:
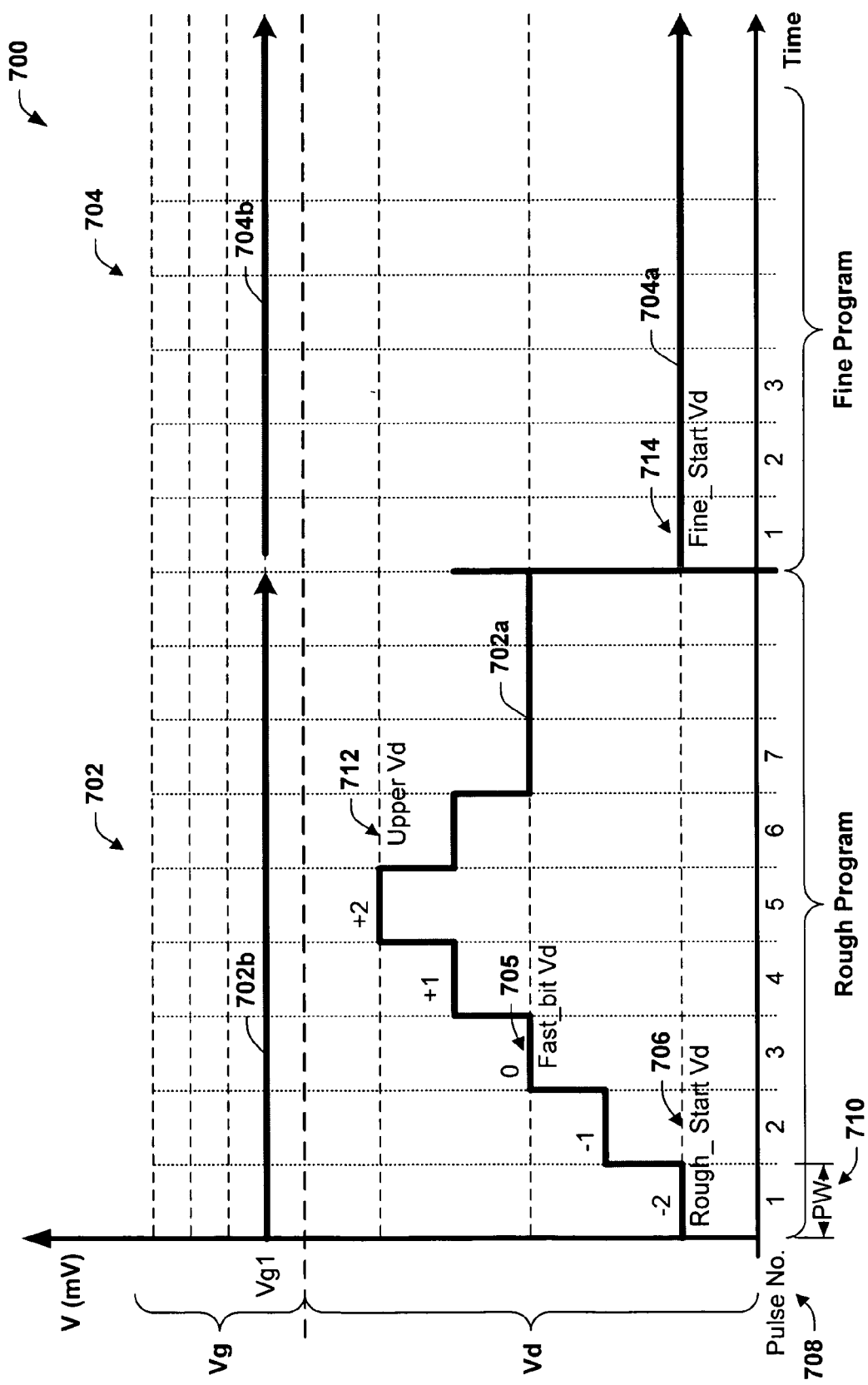

At 433 a predetermined Vd and/or Vg programming profile (as shown in FIG. 7) is selected based on the program pattern (e.g., patterns 500 of FIG. 5) that is to be programmed into the memory cells. To insure and maintain CBD control during programming of the bit-pairs, the complementary bits of the bit-pairs (e.g. left or right bits, "A" or "B" bits) are alternately selected and programmed to compensate for the particular program pattern selected. At 434 the A bits, for example, are initially read verified to determine if they have been programmed to the rough Vt level. If it is determined at 434 that no A bits have yet become programmed to the rough Vt value, a program pulse (e.g., of about 150 ns–2 µs pulsewidth) is applied at 436 of FIG. 4C, to the wordline of the selected memory cells and the selected A bits (selected via bitlines). The program pulses begin from the rough_start Vd voltage at 436 proceeding according to the selected programming profile and the alternate (complementary, "B" bits) are selected (selected via bitlines). If it is determined at 434 that one or more A bits have become programmed to the rough Vt value, the programmed bits are de-selected at 438.

At 440 the B bits are then read verified to determine if they have been programmed to the rough Vt level. If it is determined at 440 that no B bits have yet become programmed to the rough Vt value, a program pulse (e.g., of about 150 ns–2 µs pulsewidth) is applied at 442 of FIG. 4C, to the wordline of the selected memory cells and the selected B bits. As with the A bits, the program pulses to the B bits begin from the rough_start Vd voltage at 442 proceeding according to the selected programming profile and the alternate (complementary, "A" bits) are re-selected. If it is determined at 440 that one or more B bits have become programmed to the rough Vt value, the programmed bits are de-selected at 444.

If it is determined at 446, that not all bits have been programmed to the rough Vt value, then the Vd and/or the Vg is incremented (e.g., in steps of 50 mV to 200 mV) to the next pulse level of the program profile at 448. Such program pulsing and profile incrementing continues iteratively in this way alternately programming the A and B bits until it is determined that all the bits have been programmed to the rough Vt level at 446. Programming can be done in this way for each bit of a dual sided ONO flash or by giving one pulse for all the bits in a wordline or a group of selected words following the programming profile of each bit and then continue giving subsequent pulses as required for all the words selected. Thereafter, the method 400 continues back to 450 of FIG. 4A.

In the second or fine programming phase of the multi-level program method 400, the final target Vt will be achieved and the sigma of the Vt distribution will be further improved. At 450 of FIG. 4A all the bits of the memory cells of the wordline are again programmed according to another Vd and/or the Vg program profile (fine program profile), but this time to the target Vt (e.g., Vt2, Vt3, Vt4 of FIG. 3). Further, the fine programming operation is again performed on the core memory cells of the wordline based on the bit-pair program pattern until the bits of the memory cells generally correspond to a target threshold voltage.

Act 450 of FIG. 4D further illustrates one example of interactively programming and read verifying all the bits of the memory cells on the wordline by iteratively applying program pulses alternately to the A and B bits of the bit-pairs until all the bits are programmed to the target Vt. Again, the program pulses may start, for example, from about the level of the Fvd voltages previously generated and from about the level of the rough_start Vd level or greater, however, the Vd or Vg for the pulses may or may not increase or decrease according to the particular program profile selected for the fine programming.

At 451, the program Vt level that the bits will be programmed to is set to the target threshold voltage value (e.g., Vt2, Vt3, Vt4) used for the desired program level (e.g., L2, L3, L4). At 452, a fine_start Vd value is selected for the start of the fine programming operation at about the level of the rough_start Vd value or greater, and about the level of the Fvd voltages generated, while the fine program profile selected is based on the selected program pattern of the cell bit-pairs. The program patterns of FIG. 5 are used as a basis for adjusting the profile of the Vd and/or Vg programming levels and number of steps to compensate for the CBD effects otherwise produced during programming complementary bit-pairs. For example, the starting Vd may be based on the Fvd, but depending on the desired target Vt may be adjusted somewhat lower or higher than the Fvd.

At 453 a predetermined Vd and/or Vg programming profile (as shown in FIG. 7) is selected for the fine programming based on the program pattern (e.g., patterns 500 of FIG. 5) that is to be programmed into the bit-pairs of the memory cells. This predetermined fine program profile may be similar to the profile used in the rough programming operation or may be completely different, including a profile wherein the Vd and/or Vg voltage levels do not change from pulse to pulse or step to step. To insure and maintain CBD control during the fine programming of the bit-pairs, the complementary bits of the bit-pairs (e.g. left or right bits, "A" or "B" bits) are alternately selected and programmed to compensate for the particular program pattern selected. At 454 the A bits, for example, are initially read verified to determine if they have been programmed to the target Vt level. If it is determined at 454 that no A bits have yet become programmed to the target Vt value, a program pulse (e.g., about 150 ns–1 μs pulsewidth) is applied at 456 of FIG. 4D, to the wordline of the selected memory cells and the selected A bits (selected via bitlines). These program pulses begin from about the level of the rough_start Vd voltage or greater at 456 proceeding according to the selected programming profile and the alternate (complementary, "B" bits) are selected (selected via bitlines). If it is determined at 454 that one or more A bits have become programmed to the target Vt value, the programmed bits are de-selected at 458.

At 460 the B bits are then read verified to determine if they have been programmed to the target Vt level. If it is determined at 460 that no B bits have yet become programmed to the target Vt level, a program pulse (e.g., about 150 ns–1 μs pulsewidth) is applied at 462 of FIG. 4D, to the wordline of the selected memory cells and the selected B bits. As with the A bits, the program pulses to the B bits begin from the rough_start Vd voltage or higher at 462 proceeding according to the selected programming profile and the alternate (complementary, "A" bits) are re-selected. If it is determined at 460 that one or more B bits have become programmed to the target V level, the programmed bits are de-selected at 464.

If it is determined at 466, that not all bits have been programmed to the target Vt level, then the Vd and/or the Vg voltages are incremented (e.g., in 50 mV to 200 mV steps) to the next program pulse of the program profile at 468. Such program pulsing and profile incrementing continues iteratively in this way alternately programming the A and B bits until it is determined that all the bits have been programmed to the target Vt level at 466 and the method continues back to 470 of FIG. 4A of the program method 400. Thereafter the multi-level dual sided ONO flash programming method 400 of the present invention ends, at 470, wherein more word groupings of memory cells bit-pairs may be programmed to other program patterns.

FIG. 6 illustrates exemplary drain and gate voltage characterization profiles used to generate dynamic fast-bit drain voltages for a wordline of multi-level memory cell bit-pairs such as those depicted by FIGS. 1–3 using the two-phase programming algorithm of the present invention of FIGS. 4A–4D.

For example, FIG. 6 illustrates an exemplary waveform timing 600 associated with the sample programming and characterization 420 of method 400 of the present invention. After groups of the sample bits have been identified to represent the various program levels of the multi-level cell bit-pairs for a wordline, the groups are programmed to dynamically generate a drain voltage value at which each sample group may first become programmed. This voltage is identified as the "fast-bit" drain voltage for each program level (e.g., L2 and Fvd2, L3 and Fvd3, L4 and Fvd4) on a wordline. Waveform timing 600 illustrates a Vg waveform 602 and a Vd waveform 604. Either the Vg waveform 602 or the Vd waveform 604 may comprise a stepped or staircase waveform that is increased or otherwise changed, for example, in incremental steps of 50 mV to 200 mV. Vd waveform 604 begins stepping from a Start_Vd level 606 at Vd1, increasing over a sequence of program pulses 608 (e.g., pulse 1 at Vd1, pulse 2 to Vd2, pulse 3 to Vd3) having a pulsewidth (PW) 610 (e.g., 150 ns–2 μs pulses) toward a Fast-bit drain voltage (Fast_bit Vd) 612 at which the first sample bit is programmed within a sample group, or to a maximum allowable drain voltage Vdn at pulse n.

For example, in FIG. 6 the exemplary sample group may contain 5 bits where the first (fastest) bit of the group is programmed on the fourth program pulse at Vd4, while the gate voltage Vg is held constant at Vg1. If, for example, in the case of the L3 program, Vd1 is 3.0 volts and the staircase waveform increases by 100 mV per program step, then Vd2 would be 3.1 volts, Vd3 is 3.2 volts, and the Fast_bit Vd 612 is 3.3 volts at Vd4. Thus, the Fast_bit Vd (Fvd) 612 generated for this sample group represents the probable lower end of the corresponding program level (e.g., L3) specific to the wordline wherein the selected bits of the core cells reside. Either Vg and/or Vd may vary in this method, however, such variations should then be duplicated when the Fvd is used in the subsequent rough programming operation of the present invention, for example, using the two-phase algorithm and method 400 of FIGS. 4A and 4B.

FIG. 7 illustrates a plot 700 of exemplary drain and gate voltage program profiles as may be used to rough program and fine program a wordline of multi-level memory bits such as those of FIGS. 1–3 in accordance with the present invention of program method 400 of FIGS. 4A–4D. FIG. 7 illustrates one example of a rough program profile 702 and a fine program profile 704 for interactively programming and read verifying all the bits of the memory cells on a wordline first to a rough Vt level then to a target Vt level. Rough program profile 702 and fine program profile 704 each comprise a predetermined Vd and/or Vg stepping pulse sequence or program profile for iteratively applying program pulses alternately to the A and B bits of the bit-pairs until all the bits are programmed to the target Vt. Accordingly, rough program profile 702 comprises a predetermined rough Vd program profile 702a, and/or a predetermined rough Vg program profile 702b, while fine program profile 704 comprises a predetermined fine Vd program profile 704a, and/or a predetermined fine Vg program profile 704b.

The fast_bit Vd (Fvd) 705 generated from method step 420 above using the waveform of FIG. 6, is used as the basis for determining a starting point rough_start Vd 706 for the rough programming profile 702. For example, as shown in FIG. 7, the program pulses start from the rough_start Vd 706, which may be two Vd voltage steps below the Fast_bit Vd 705 (−2 steps relative to Fvd 705, each step represents, for example, a voltage level of 50 mV to 200 mV), or another such starting point relative to Fvd 705. By starting the program pulses at a voltage value adequately below the Fvd 705, the bits of the core cells will be programmed to a level that precisely programs the fastest of the "fast-bits", yet avoids overshooting the rough Vt value.

Program pulses 708 (e.g., pulses 1, 2, 3 . . . ) of the Vd and/or Vg voltages, having pulse width PW 710 (e.g., 150 ns–2 µs pulses) preferably increase (e.g., 50–200 mV per step) as the pulses increment along the rough program profile 702 back up to the Fvd 705 level. However, such program profiles 702 and 704 may or may not increase or decrease according to the particular program profile selected as determined by the program pattern (e.g., 500 of FIG. 5) utilized by the bit-pairs. For example, one program profile (e.g., 702 or 704) may be selected to correspond to a 2-4 bit-pair program pattern, while a 3-2 program pattern may correspond to a completely different program profile. Furthermore, the rough program profile 702 may be independently chosen from the fine program profile 704.

Figure 8:
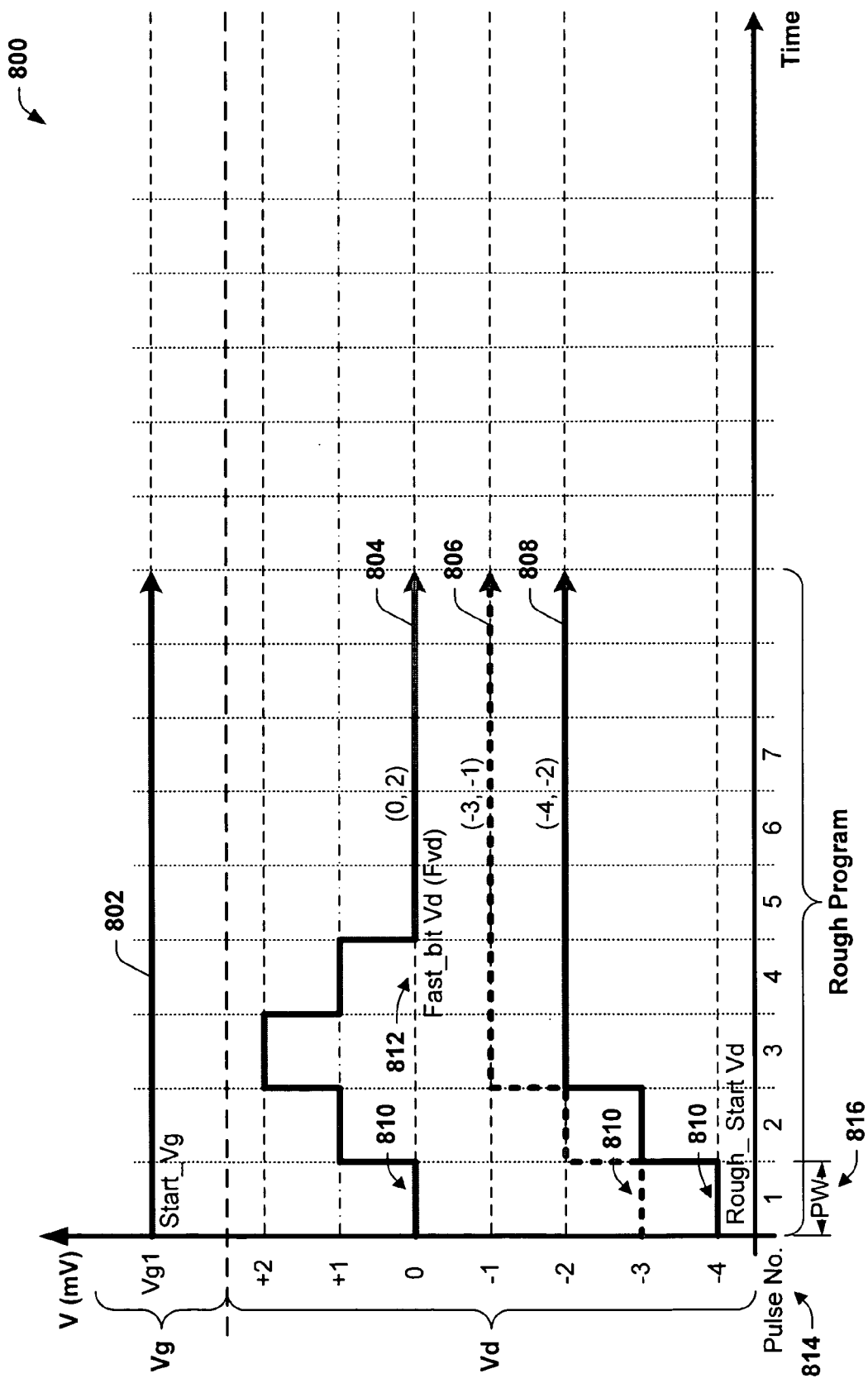

FIG. 8 illustrates several exemplary drain and gate voltage program profiles 800 as may be used to rough program a wordline of multi-level memory cell bit-pairs such as those depicted by FIGS. 1–3 using the multi-level programming algorithm of the present invention of the method of FIGS. 4A–4D.

Program pulse stepping may continue increasing above Fvd 705 to an Upper Vd 712 to permit programming of the "slow bits" on the wordline that may need a higher program Vd. If the rough program profile 702 steps above Fvd 705, then the profile 702 will also immediately begin stepping back down to Fvd 705 as shown at pulses 6 and 7 to avoid over-programming the bits. Thereafter, programming continues at the Fvd 705 level until the rough Vt level is achieved or a maximum number of program pulses is attained. If a bit attains this maximum number of programming pulses, the bit or cell may be failed.

After the rough threshold voltage level is achieved, the fine programming operation begins at a generally low level fine_start Vd 714, about the level of the rough_start Vd 706. However, fine_start Vd 714 may be somewhat higher than rough_start Vd 706, and may or may not increase with each successive programming pulse 708 (e.g., pulses 1, 2, 3 . . . ). Fine programming pulses are applied to the wordline according to fine program profile 704 as determined by the program pattern (e.g., 500 of FIG. 5) utilized by the bit-pairs. Thus this program profile, may again vary between the particular program patterns utilized, for example, according to a look-up table of program profiles vs program patterns. Fine programming continues with each program pulse along the fine program profile 704 until the target Vt is attained. Although the fine programming pulse width 710 is illustrated as the same as that of the rough programming operation, the fine programming pulses may have a different pulse width 710, (e.g., a narrower pulse width, 150 ns–1 µs), and the Vd and/or Vg step amplitude (if increased) may be smaller than that of the rough programming step amplitude (e.g., 50–200 mV change per step).

FIG. 8 illustrates several exemplary drain and gate voltage program profiles 800 as may be used to rough program a wordline of multi-level memory cell bit-pairs such as those depicted by FIGS. 1–3 using the multi-level programming algorithm of the present invention of the method 400 of FIGS. 4A–4D. As indicated above, the drain and gate voltage program profiles 800 chosen to rough program the bits of the core memory cells may be determined by the particular program pattern (e.g., 500 of FIG. 5) utilized by the bit-pairs. For example, a gate voltage Vg 802 may remain constant while the Vd profiles 804, 806, 808 represent several program profiles utilized to compensate the CBD of the cell bit-pairs when three different predetermined program patterns A1-B1, A2-B2, and A3–B3, respectively, are utilized by the bit-pairs. Program pattern A1-B1, for example, may be a 2-3 pattern or a 4-1 pattern as predetermined by a look-up table of program profiles vs program patterns.

Program profiles 804, 806, 808 all begin at a rough_start Vd 810, which is relative to the fast_bit Vd 812. For example, rough program profile 804, is selected corresponding to program profile A1-B1, where the rough_start Vd 810 for profile 804 begins with an offset of "0" steps from or relative to fast_bit Vd 812. Similarly, profile 806 may be selected corresponding to program profile A2-B2, where the rough_start Vd 810 for profile 806 begins with an offset of "–3" steps relative to fast_bit Vd 812, placing the start point three pulses or three step amplitudes below the fast_bit Vd 812 level. In the same way, profile 808 may be selected corresponding to program pattern A3-B3, where the rough_start Vd 810 for profile 808 begins with an offset of "–4" steps relative to fast_bit Vd 812.

Again, as each program pulse 814 is applied to the bits having pulse width PW 816, the program profile increments to the next step in the profile, where the maximum pulse amplitude may be specified according to the profile to further compensate the effects of CBD on the cell bit-pairs. For example, profile 804 may also specify that the Vd voltage should step to a level that is offset (+2) relative to fast_bit Vd 812, while profile 806 should step to a level that is offset (–1) relative to fast_bit Vd 812, and profile 808 should step to a level that is offset (–2) relative to fast_bit Vd 812. Accordingly, a coding system may therefore be assigned to each profile based on the corresponding program pattern, such as (0,2) for profile 804 corresponding to program pattern A1-B1, (–3,–1) for profile 806 corresponding to program pattern A2-B2, and (–4,–2) for profile 808 corresponding to program pattern A3-B3. Other program profiles and corresponding program patterns are anticipated in the context of the present invention, including Vd and/or Vg voltage, pulse width, and step amplitude variations.

Figure 9:
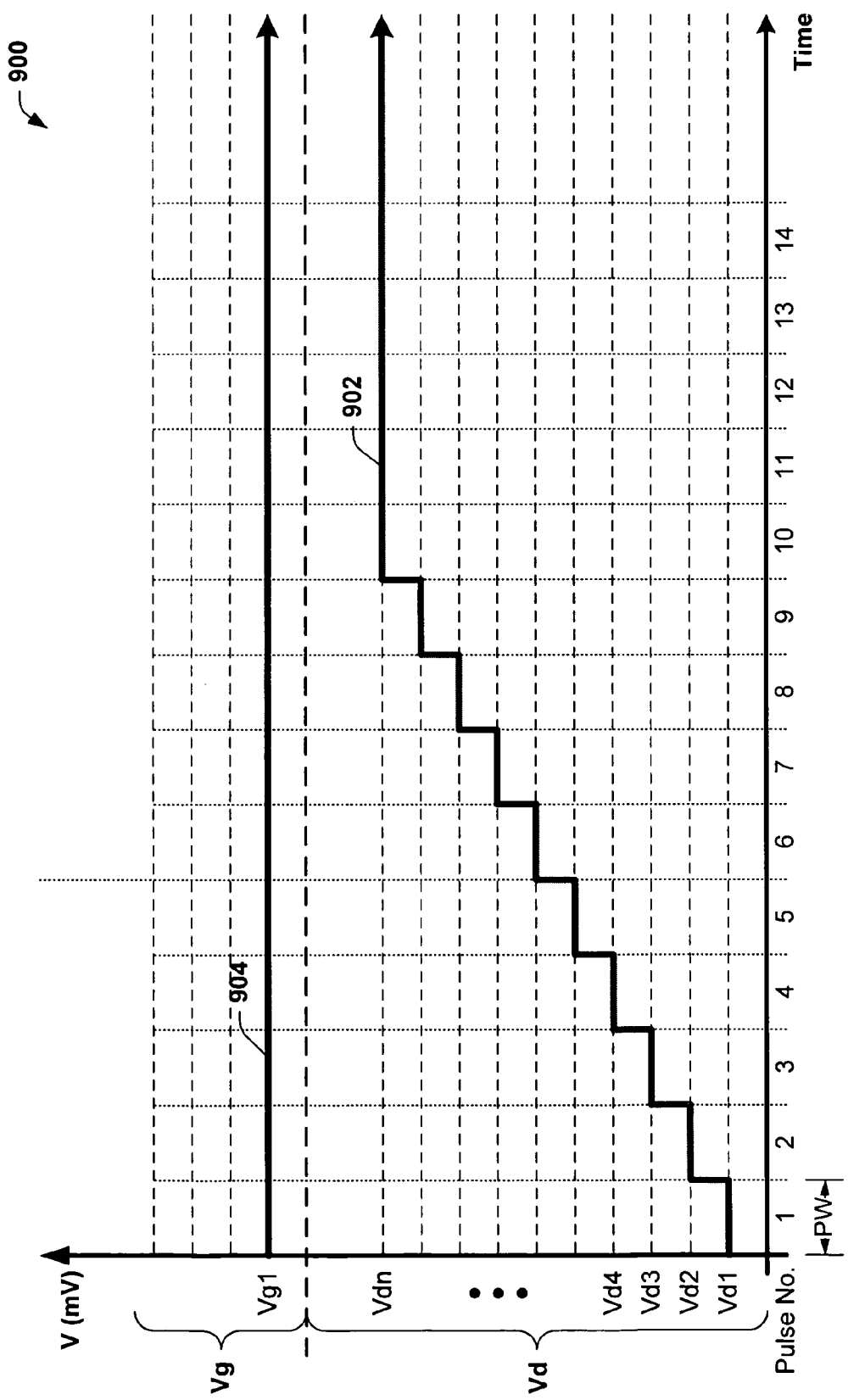
Figure 10:
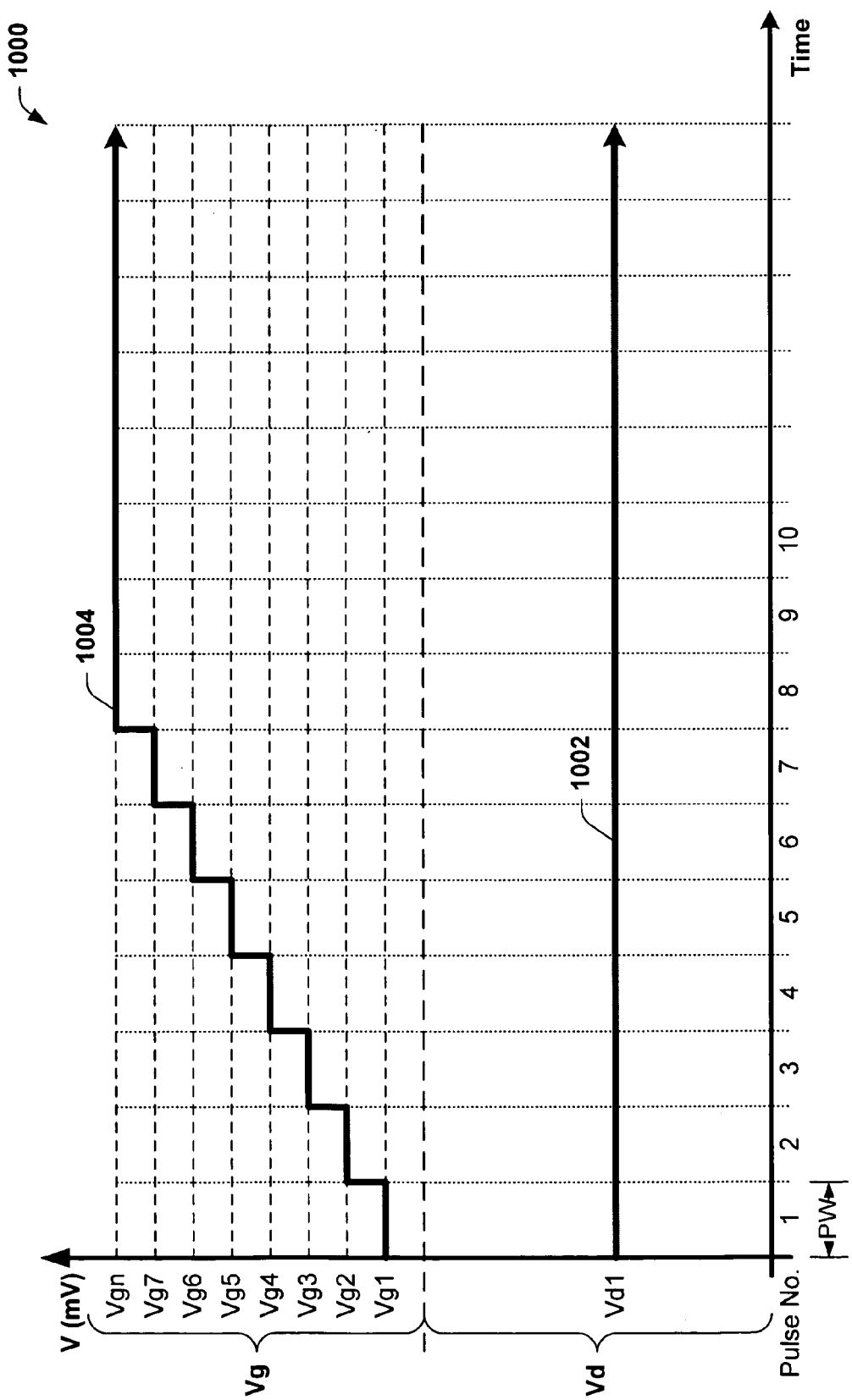
Figure 11:
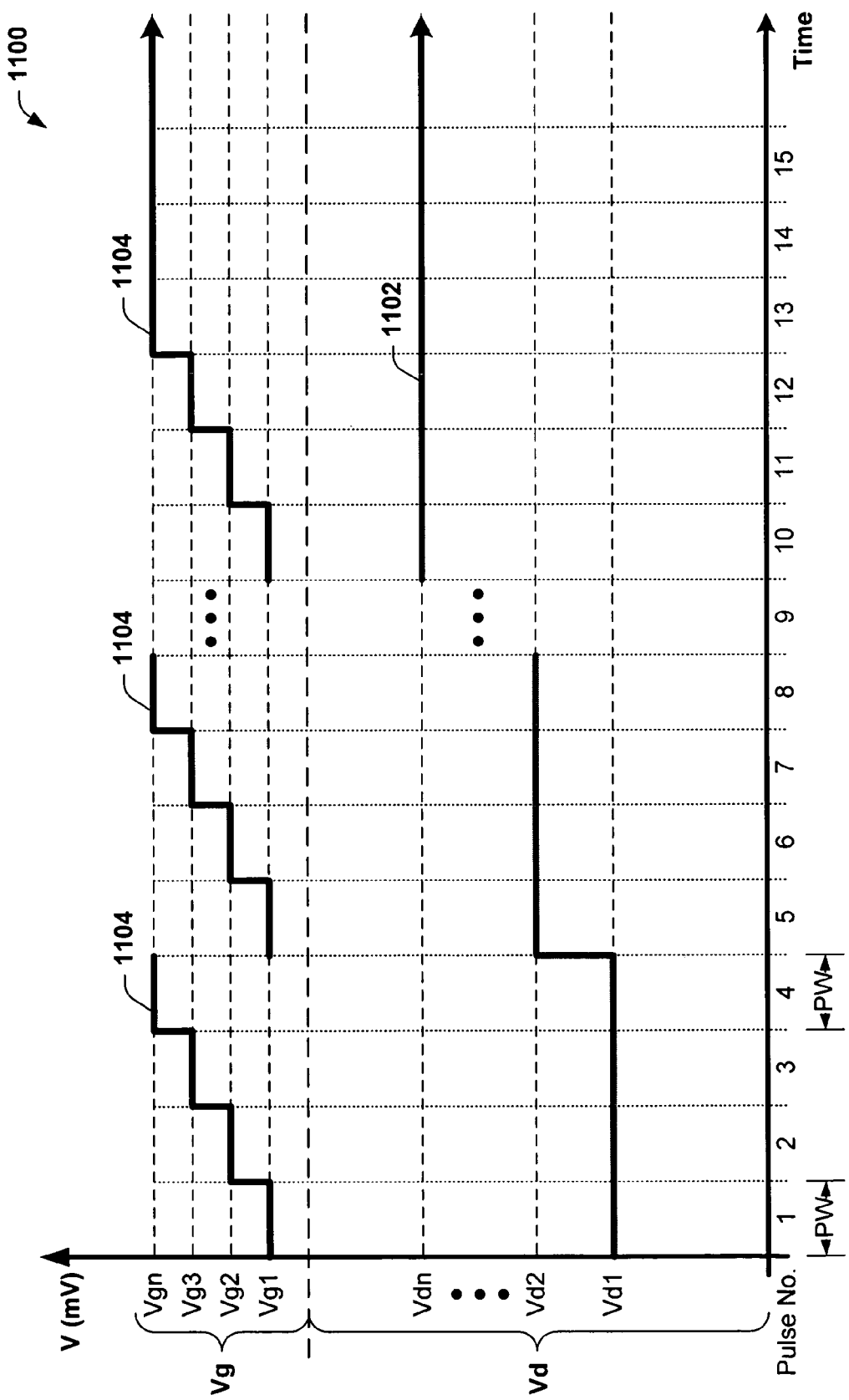

For example, FIGS. 9–11 further illustrate exemplary drain and gate voltage program profiles as may be used to rough program, and fine program a wordline of multi-level memory cell bit-pairs such as those depicted by FIGS. 1–3 using the two-phase programming algorithm of the present invention of FIGS. 4A–4D. As indicated previously, the Vd and/or Vg rough and fine programming operations utilized herein may apply program pulse widths of about 150 ns to about 2 µs, for example, and a Vd and/or Vg step amplitude (if increased or otherwise changed) of about 50 mV to about 200 mV change per step.

FIG. 9 illustrates another exemplary program profile 900 of the Vd and/or the Vg voltages such as may be used in either the rough or fine programming operations of method 400 of FIGS. 4A–4D. Profile 900 comprises a Vd profile 902 and a Vg profile 904, wherein numerous small Vd steps (e.g., Vd1 to Vdn) are utilized to achieve the rough Vt or target Vt, while the Vg level remains constant.

FIG. 10 illustrates still another exemplary program profile 1000 of the Vd and/or the Vg voltages such as may be used in either the rough or fine programming operations of method 400 of FIGS. 4A–4D. Profile 1000 comprises a Vd profile 1002 and a Vg profile 1004, wherein numerous small Vg steps (e.g., Vg1 to Vgn) are utilized to achieve the rough Vt or target Vt, while the Vd level remains constant.

FIG. 11 illustrates yet another exemplary program profile 1100 of the Vd and/or the Vg voltages such as may be used in either the rough or fine programming operations of method 400 of FIGS. 4A–4D. Profile 1100 comprises a Vd profile 1102 and a Vg profile 1104, wherein a combination of Vd steps and Vg steps are utilized to achieve the rough Vt or target Vt. In this variation, each Vd step (e.g., Vd1 to Vdn) is followed by small sequence of Vg steps (e.g., Vg1 to Vgn) to accomplish another form of rough or fine programming in accordance with several aspects of the present invention.

Further, it is anticipated that additional phases of rough and fine programming may be used at selected additional intermediate programming values between the rough threshold voltage and the final target threshold voltage. For example, if the target Vt for L3 of a multi-level flash memory is 2.1V, and the rough Vt for L3 was set at 400 mV less than the target Vt (e.g., 1.7V), then an intermediate Vt at, for example, 200 mV less than the target Vt (e.g., 1.9V) may be established to achieve a more precise programming level and Vt distribution at each program level.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of programming one or more memory bits on a wordline of a multi-level flash memory array, the memory bits having two or more program levels and a blank level, the levels comprising three or more data levels corresponding to three or more threshold voltages, the method comprising:
providing one or more unprogrammed multi-level flash memory bits to be programmed;
performing a rough programming operation on the memory bits of the array until the threshold voltage of each of the memory bits generally corresponds to a rough threshold voltage that is an offset value less than a target threshold voltage; and
performing a fine programming operation on the memory bits of the array until the threshold voltage of each memory bit generally corresponds to the target threshold voltage; and
generating a dynamic fast-bit drain voltage for each of the program levels on the wordline; wherein generating the dynamic fast-bit drain voltage comprises:
selecting groups of sample bits from the wordline associated with each program level;
selecting a starting drain voltage for each program level from the lowest allowable drain voltage for each program level;
applying program pulses to a first group of sample bits associated with a first program level;
increasing one of the drain voltage, a gate voltage, and a combination of the drain and gate voltages of the first group of sample bits;
determining a first drain voltage at which a fast-bit of the group of sample bits is programmed or a maximum drain voltage level is attained; and
reselecting another group of sample bits associated with a program level, applying program pulses, increasing one of the drain and gate voltages until a fast-bit drain voltage is determined for each group of sample bits associated with a respective program level.

2. The method of claim 1, wherein each memory bit of the multi-level flash memory array comprises four data levels.

3. The method of claim 1, wherein memory cells of the multi-level flash memory array comprise dual sided ONO flash memory cells having three or more data levels per bit.

4. The method of claim 1, further comprising alternately applying the programming pulses to each of the memory bits of memory cell bit-pairs in order to obtain improved CBD control.

5. The method of claim 1, wherein the predetermined programming profile comprises a predetermined pattern of the drain and gate voltages that are applied to the memory bits over the successive programming pulses.

6. The method of claim 5, wherein the predetermined programming profile further varies one of the drain voltage, the gate voltage, and a combination of the drain and gate voltages from an initial rough start drain voltage and an initial rough start gate voltage relative to a dynamic fast-bit drain voltage generated for each of the program levels on the wordline.

7. The method of claim 5, wherein the predetermined programming profile provides the rough start drain voltage, and an upper drain voltage based on a predetermined number of program pulses offset relative to the dynamic fast-bit drain voltage.

8. The method of claim 5, wherein the predetermined pattern of the drain and gate voltages comprise successive programming pulses that change by about 50 mV to about 200 mV per pulse.

9. The method of claim 5, wherein the predetermined pattern of the drain and gate voltages comprise programming pulses of about 150 ns–2 μs width.

10. The method of claim 1, wherein the program pattern of the cell bit-pairs comprises the program levels of all the bits of the memory cells.

11. The method of claim 1, wherein all the cell bit-pairs selected on the wordline have the same program patterns.

12. A method of programming one or more memory bits on a wordline of a multi-level flash memory array, the memory bits having two or more program levels and a blank level, the levels comprising three or more data levels corresponding to three or more threshold voltages, the method comprising:
providing one or more unprogrammed multi-level flash memory bits to be programmed;
performing a rough programming operation on the memory bits of the array until the threshold voltage of each of the memory bits generally corresponds to a rough threshold voltage that is an offset value less than a target threshold voltage; and performing a fine programming operation on the memory bits of the array until the threshold voltage of each memory bit generally corresponds to the target threshold voltage, wherein the rough programming operation comprises:
  setting a program verify value to correspond to the rough threshold voltage;
  selecting a predetermined programming profile of drain and gate voltages for programming the bits based on a program pattern of the cell bit-pairs;
  applying a programming pulse to the bits according to the programming profile;
  reapplying programming pulses to the bits according to the programming profile until the threshold voltage of each bit of the memory cells generally corresponds to the rough threshold voltage of the program verify value; and
  deselecting the rough programmed bits.

13. A method of programming one or more memory bits on a wordline of a multi-level flash memory array, the memory bits having two or more program levels and a blank level, the levels comprising three or more data levels corresponding to three or more threshold voltages, the method comprising:
  providing one or more unprogrammed multi-level flash memory bits to be programmed;
  performing a rough programming operation on the memory bits of the array until the threshold voltage of each of the memory bits generally corresponds to a rough threshold voltage that is an offset value less than a target threshold voltage; and
  performing a fine programming operation on the memory bits of the array until the threshold voltage of each memory bit generally corresponds to the target threshold voltage, wherein the rough and fine programming operations comprise programming pulses of drain and gate voltages applied to the memory bits, and wherein the programming pulses of the rough and fine programming operations have about the same pulse width and about the same step amplitude.

14. A method of programming one or more memory bits on a wordline of a multi-level flash memory array, the memory bits having two or more program levels and a blank level, the levels comprising three or more data levels corresponding to three or more threshold voltages, the method comprising:
  providing one or more unprogrammed multi-level flash memory bits to be programmed;
  performing a rough programming operation on the memory bits of the array until the threshold voltage of each of the memory bits generally corresponds to a rough threshold voltage that is an offset value less than a target threshold voltage; and
  performing a fine programming operation on the memory bits of the array until the threshold voltage of each memory bit generally corresponds to the target threshold voltage, wherein the fine programming operation comprises:
    setting a program verify value to correspond to the target threshold voltage;
    selecting a predetermined programming profile of drain and gate voltages for programming the bits based on a program pattern of the cell bit-pairs;
    applying a programming pulse to the bits according to the programming profile;
    reapplying programming pulses to the bits according to the programming profile until the threshold voltage of each bit of the memory cells generally corresponds to the fine threshold voltage of the program verify value; and
    deselecting the fine programmed bits.

15. The method of claim 14, further comprising alternately applying the programming pulses to each bit of the memory cell bit-pairs in order to obtain improved CBD control.

16. The method of claim 14, wherein the predetermined programming profile comprises a predetermined pattern of the drain and gate voltages that are applied to the memory bits over successive programming pulses.

17. The method of claim 16, wherein the predetermined programming profile further varies one of the drain voltage, the gate voltage, and a combination of the drain and gate voltages relative to an initial fine start drain voltage and an initial fine start gate voltage.

18. The method of claim 17, wherein the initial fine start drain voltage is about the level of the rough start drain voltage or higher.

19. The method of claim 14, wherein the program pattern of the cell bit-pairs comprises the program levels of all the bits of the memory cells.

20. The method of claim 14, wherein all the cell bit-pairs selected on the wordline have the same program patterns.

21. A method of programming one or more memory bits on a wordline of a multi-level flash memory array, the memory bits having two or more program levels and a blank level, the levels comprising three or more data levels corresponding to three or more threshold voltages, the method comprising:
  providing one or more unprogrammed multi-level flash memory bits to be programmed;
  performing a rough programming operation on the memory bits of the array until the threshold voltage of each of the memory bits generally corresponds to a rough threshold voltage that is an offset value less than a target threshold voltage; and
  performing a fine programming operation on the memory bits of the array until the threshold voltage of each memory bit generally corresponds to the target threshold voltage, further comprising selecting all of the bits on the wordline that are to have the bit-pairs programmed to the same program pattern.

22. A method of programming one or more memory bits on a wordline of a multi-level flash memory array, the memory bits having two or more program levels and a blank level, the levels comprising three or more data levels corresponding to three or more threshold voltages, the method comprising:
  providing one or more unprogrammed multi-level flash memory bits to be programmed;
  performing a rough programming operation on the memory bits of the array until the threshold voltage of each of the memory bits generally corresponds to a rough threshold voltage that is an offset value less than a target threshold voltage; and
  performing a fine programming operation on the memory bits of the array until the threshold voltage of each memory bit generally corresponds to the target threshold voltage, wherein all the cell bit-pairs selected on the wordline have the same program patterns, and wherein the predetermined programming profile comprises a predetermined pattern of the drain and gate voltages that are applied to the memory bits over successive programming pulses based on the program pattern of the cell bit-pairs selected.

23. The method of claim 22, wherein the programming profile is determined by a look-up table corresponding to the program pattern of the cell bit-pairs.

24. The method of claim 22, wherein one of the drain voltage and the gate voltage is held constant while the other of the voltages follows the programming profile.

25. The method of claim 22, wherein the drain voltage and the gate voltage follow the programming profile.

26. A method of programming one or more memory bits on a wordline of a multi-level flash memory array, the memory bits having two or more program levels and a blank level, the levels comprising three or more data levels corresponding to three or more threshold voltages, the method comprising:
providing one or more unprogrammed multi-level flash memory bits to be programmed;
performing a rough programming operation on the memory bits of the array until the threshold voltage of each of the memory bits generally corresponds to a rough threshold voltage that is an offset value less than a target threshold voltage; and p1 performing a fine programming operation on the memory bits of the array until the threshold voltage of each memory bit generally corresponds to the target threshold voltage, wherein the rough threshold voltage is offset lower than the target threshold voltage by about 150–450 mV.

27. A method of programming one or more bits of memory cell bit-pairs on a wordline of a multi-level flash memory array, the bits of the memory cells having two or more program levels and a blank level, the levels comprising three or more data levels corresponding to three or more threshold voltages, the method comprising:
providing one or more unprogrammed multi-level flash memory bits selected to be programmed to the same program pattern;
generating a dynamic fast-bit drain voltage for each of the program levels on the wordline;
performing a rough programming operation on the bits of the array based on one of the fast-bit drain voltages and the cell program pattern until the threshold voltage of each bit of the memory cells generally corresponds to a rough threshold voltage that is an offset value less than a target threshold voltage; and
performing a fine programming operation on the memory bits of the array until the threshold voltage of each bit generally corresponds to the target threshold voltage.

28. The method of claim 27, wherein the bits of the memory cells of the multi-level flash memory array comprise three or more data-levels.

29. The method of claim 27, wherein the memory cells of the multi-level flash memory array comprise dual sided ONO three or more data-levels per bit flash memory cells.

30. The method of claim 27, wherein the generating a dynamic fast-bit drain voltage for each of the two or more program levels on the wordline comprises:
selecting groups of sample bits from the wordline associated with each program level;
selecting a starting drain voltage for each program level from the lowest allowable drain voltage for each program level;
applying program pulses to a first group of sample bits associated with a first program level;
increasing one of the drain voltage, a gate voltage, and a combination of the drain and gate voltages of the first group of sample bits;
determining a first drain voltage at which a fast-bit of the group of sample bits is programmed or a maximum drain voltage level is attained; and
reselecting another group of sample bits associated with a program level, applying program pulses, increasing one of the drain and gate voltages until a fast-bit drain voltage is determined for each group of sample bits associated with a respective program level.

31. The method of claim 27, wherein the rough programming operation comprises:
setting a program verify value to correspond to the rough threshold voltage;
selecting a predetermined programming profile of drain and gate voltages for programming the bits based on a program pattern of the cell bit-pairs;
applying a programming pulse to the bits according to the programming profile;
reapplying programming pulses to the bits according to the programming profile until the threshold voltage of each bit of the memory cells generally corresponds to the rough threshold voltage of the program verify value; and
deselecting the rough programmed bits.

32. The method of claim 31, further comprising alternately applying the programming pulses to each bit of the memory cell bit-pairs in order to obtain improved CBD control.

33. The method of claim 31, wherein the predetermined programming profile comprises a predetermined pattern of the drain and gate voltages that are applied to the memory bits over successive programming pulses.

34. The method of claim 33, wherein the predetermined programming profile further varies one of the drain voltage, the gate voltage, and a combination of the drain and gate voltages from an initial rough art drain voltage and an initial rough art gate voltage relative to a dynamic fast-bit drain voltage generated for each of the two or more program levels on the wordline.

35. The method of claim 33, wherein the predetermined programming profile provides a rough art drain voltage, and an upper drain voltage based on a predetermined number of program pulses offset relative to the dynamic fast-bit drain voltage.

36. The method of claim 33, wherein the predetermined pattern of the drain and gate voltages comprise successive programming pulses that change by about 50 mV to about 200 mV per pulse.

37. The method of claim 33, wherein the predetermined pattern of the drain and gate voltages comprise programming pulse width of about 150 ns–2 µs.

38. The method of claim 31, wherein the program pattern of the cell bit-pairs comprises the program levels of all the bits of the memory cells.

39. The method of claim 27, wherein the fine programming operation comprises:
setting a program verify value to correspond to the target threshold voltage;
selecting a predetermined programming profile of drain and gate voltages for programming the bits based on a program pattern of the cell bit-pairs;
applying a programming pulse to the bits according to the programming profile;
reapplying programming pulses to the bits according to the programming profile until the threshold voltage of each bit of the memory cells generally corresponds to the fine threshold voltage of the program verify value; and deselecting the fine programmed bits.

40. The method of claim 39, further comprising alternately applying the programming pulses to each bit of the memory cell bit-pairs in order to obtain improved CBD control.

41. The method of claim 39, wherein the predetermined programming profile comprises a predetermined pattern of the drain and gate voltages that are applied to the memory bits over successive programming pulses.

42. The method of claim 41, wherein the predetermined programming profile further varies one of the drain voltage, the gate voltage, and a combination of the drain and gate voltages relative to an initial fine start drain voltage and an initial fine start gate voltage.

43. The method of claim 41, wherein the initial fine start drain voltage is about the level of the rough start drain voltage or greater.

44. The method of claim 39, wherein the program pattern of the cell bit-pairs comprises the program levels of all the bits of the memory cells.

45. The method of claim 27, wherein all the cell bit-pairs selected on the wordline have the same program patterns, and wherein the predetermined programming profile comprises a predetermined pattern of the drain and gate voltages that are applied to the memory bits over successive programming pulses based on the program pattern of the cell bit-pairs selected.

46. The method of claim 45, wherein the programming profile is determined by a look-up table corresponding to the program pattern of the cell bit-pairs.

47. The method of claim 45, wherein one of the drain voltage and the gate voltage is held constant while the other of the voltages follows the programming profile.

48. The method of claim 45, wherein the drain voltage and the gate voltage follow the programming profile.

49. The method of claim 27, wherein the rough threshold voltage is offset lower than the target threshold voltage by about 150–450 mV.

50. The method of claim 27, wherein an intermediate programming operation is utilized having an intermediate threshold voltage value between the rough threshold voltage and the target threshold voltage value.

51. The method of claim 27, further comprising erasing a portion of the bits of the memory array prior to performing the rough programming operation.

52. The method of claim 27, wherein the programming operation increases threshold voltage levels generally corresponding to bits of respective memory cells of the sector.

53. The method of claim 27, wherein the rough and fine programming operations comprise programming pulses of drain and gate voltages applied to the memory bits, and wherein the programming pulses of the rough and fine programming operations have about the same pulse width and about the same step amplitude.

* * * * *